United States Patent
Yamamoto

(10) Patent No.: US 10,122,883 B2
(45) Date of Patent: Nov. 6, 2018

(54) IMAGE PROCESSING APPARATUS INCLUDING CIRCUIT CONFIGURATION AND METHOD OF CONTROLLING THE SAME

(71) Applicant: CANON KABUSHIKI KAISHA, Tokyo (JP)

(72) Inventor: Naohiro Yamamoto, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/119,803

(22) PCT Filed: Mar. 31, 2015

(86) PCT No.: PCT/JP2015/060688
§ 371 (c)(1),
(2) Date: Aug. 18, 2016

(87) PCT Pub. No.: WO2015/156236
PCT Pub. Date: Oct. 15, 2015

(65) Prior Publication Data
US 2017/0064097 A1    Mar. 2, 2017

(30) Foreign Application Priority Data

Apr. 8, 2014 (JP) .................. 2014-079726

(51) Int. Cl.
*H04N 1/00* (2006.01)
*G06T 1/20* (2006.01)
(Continued)

(52) U.S. Cl.
CPC ......... *H04N 1/0097* (2013.01); *G06F 3/1204* (2013.01); *G06F 3/1205* (2013.01);
(Continued)

(58) Field of Classification Search
USPC ................................ 358/1.1–3.29, 1.11–1.18
See application file for complete search history.

(56) References Cited

U.S. PATENT DOCUMENTS 6,219,149 B1 * 4/2001 Kawata .................. G06K 15/02
358/1.11
7,793,092 B2 * 9/2010 Toi ........................ G06F 1/3218
713/1
(Continued)

FOREIGN PATENT DOCUMENTS

JP    2002181897 A    6/2002
JP    2005025599 A    1/2005
(Continued)

OTHER PUBLICATIONS

International Search Report issued in PCT/JP2015/060688, dated Jul. 7, 2015. Form PCT/ISA/210.
(Continued)

Primary Examiner — Marcellus Augustin
(74) Attorney, Agent, or Firm — Rossi, Kimms & McDowell LLP

(57) ABSTRACT

An image processing apparatus specifies a difference between a circuit configuration for processing an accepted job and a circuit configuration configured in a reconfiguration circuit, and based on the difference, selects a functional block to be reconfigured in the reconfiguration circuit, and reconfigures the reconfiguration circuit by reading configuration data from storage unit.

22 Claims, 20 Drawing Sheets

(51) Int. Cl.
*H03K 19/177* (2006.01)
*G06F 3/12* (2006.01)
*H04N 1/32* (2006.01)

(52) U.S. Cl.
CPC .......... *G06F 3/1243* (2013.01); *G06F 3/1248* (2013.01); *G06T 1/20* (2013.01); *H03K 19/1776* (2013.01); *H03K 19/17748* (2013.01); *H03K 19/17756* (2013.01); *H03K 19/17776* (2013.01); *H04N 1/32122* (2013.01); *H04N 2201/0094* (2013.01)

(56) References Cited

U.S. PATENT DOCUMENTS

| | | | | |
|---|---|---|---|---|
| 7,864,620 B1* | 1/2011 | Pedersen | .............. | G11C 7/1006 365/154 |
| 8,686,753 B1* | 4/2014 | Herrmann | ........ | H03K 19/17756 326/16 |
| 8,761,526 B2* | 6/2014 | Okuyama | ................. | G06T 1/20 362/307 |
| 9,172,370 B2* | 10/2015 | Ikeda | ................. | H03K 19/0016 |
| 9,576,095 B1* | 2/2017 | Hew | .................... | G06F 17/5068 |
| 2002/0078266 A1 | 6/2002 | Watanabe et al. | | |
| 2003/0061409 A1* | 3/2003 | RuDusky | .............. | G06F 3/0481 710/8 |

FOREIGN PATENT DOCUMENTS

| | | |
|---|---|---|
| JP | 2012234337 A | 10/2008 |
| JP | 2012234337 A | 11/2012 |

OTHER PUBLICATIONS

Written Opinion issued in PCT/JP2015/060688, dated Jul. 7, 2015. Form PCT/ISA/237.

Office Action issued in Japanese Appln. No. 2014-079726 dated Jun. 19, 2018.

* cited by examiner

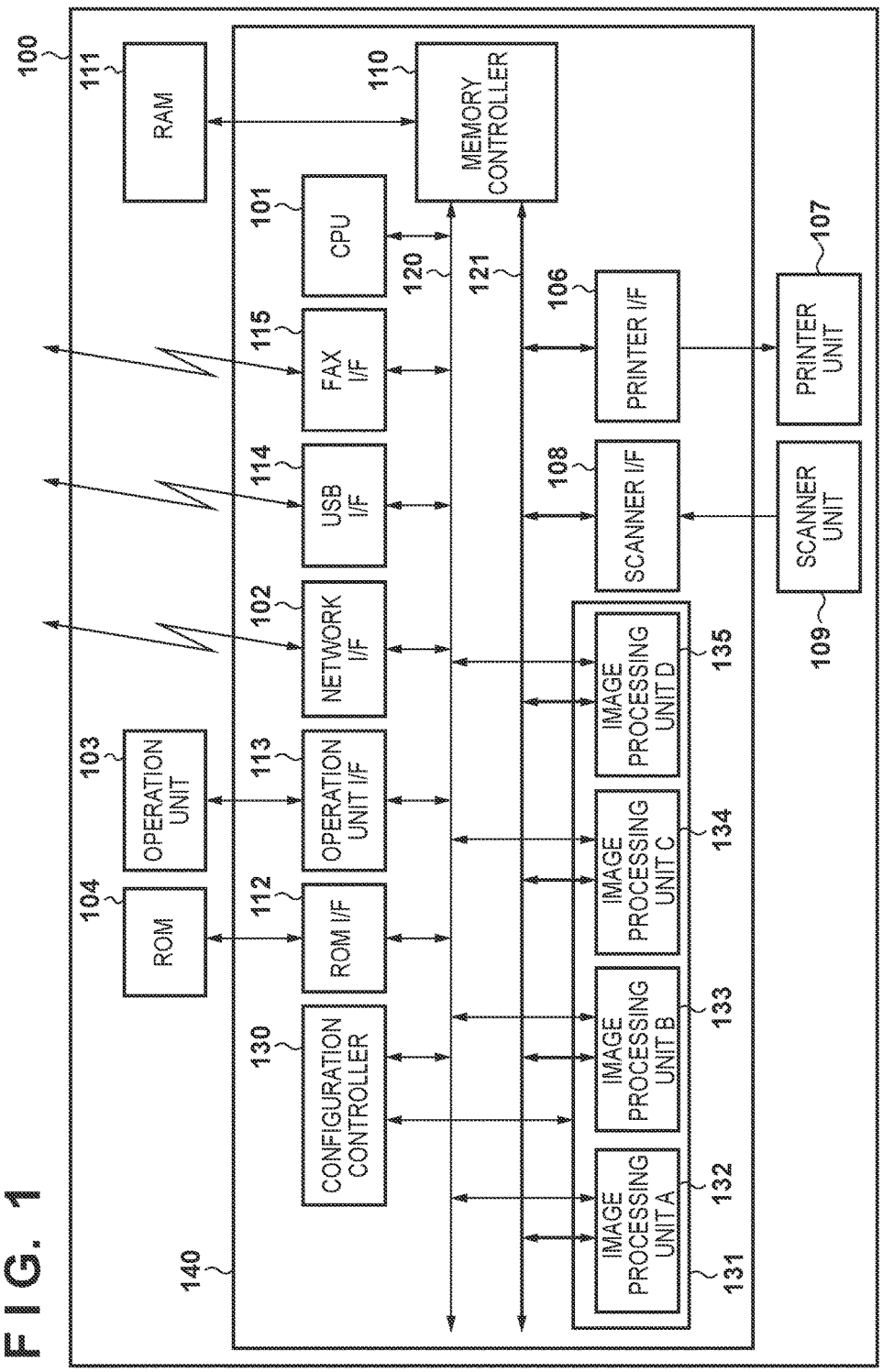

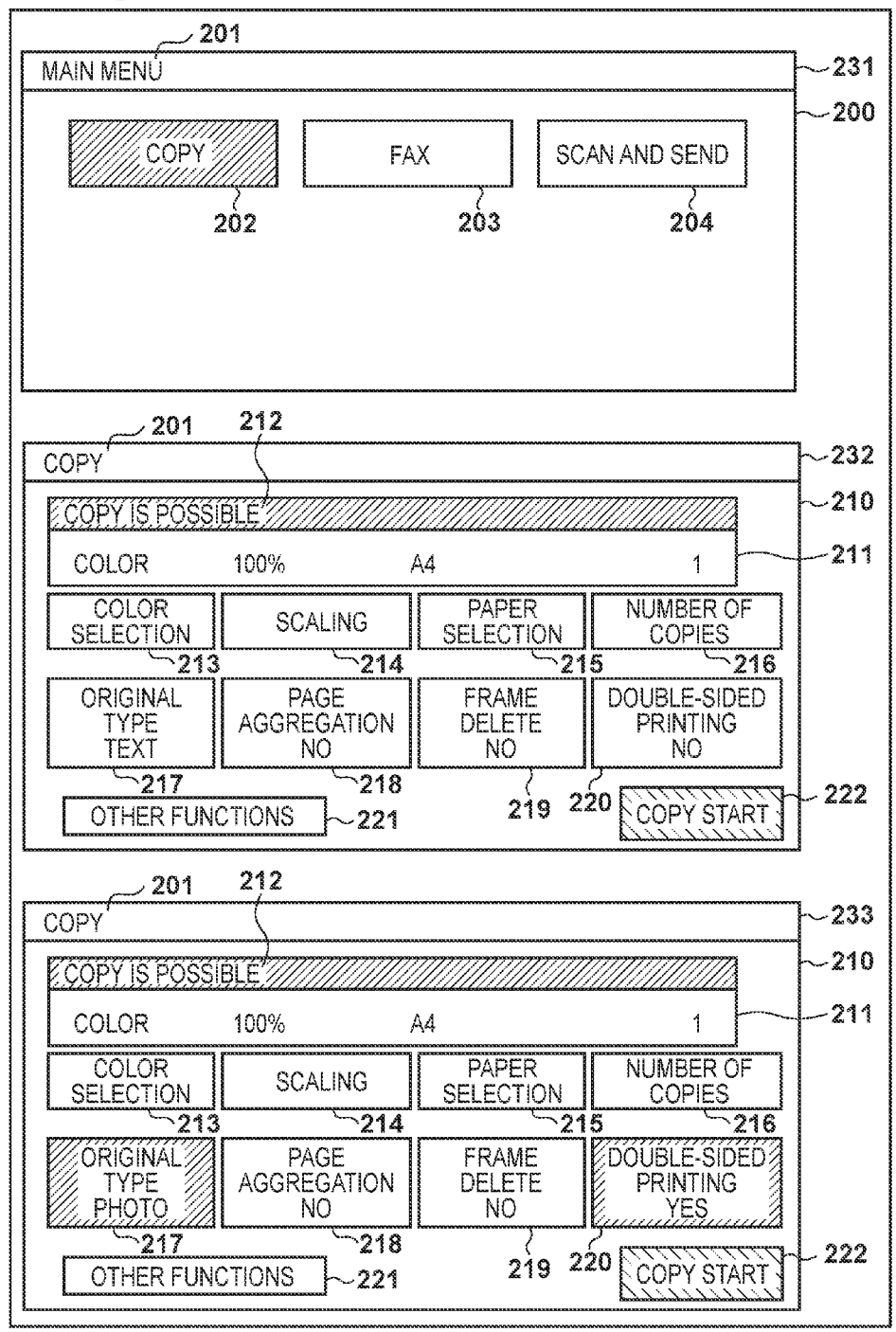

FIG. 3A

| JOB TYPE | SETTING | SCAN PROCESSING | | | PRINT PROCESSING | | |
|---|---|---|---|---|---|---|---|
| | | IMAGE PROCESSING 1 | IMAGE PROCESSING 2 | IMAGE PROCESSING 3 | IMAGE PROCESSING 1 | IMAGE PROCESSING 2 | IMAGE PROCESSING 3 |
| COPY | MONOCHROME | × | ○ | ○ | ○ | ○ | ○ |
| | COLOR | ○ | × | ○ | ○ | × | ○ |
| | SCALING | × | × | ○ | × | × | ○ |
| | ORIGINAL TYPE | ○ | ○ | ○ | ○ | × | ○ |
| | DOUBLE-SIDED PRINTING | ○ | ○ | ○ | — | — | — |
| PDL | MONOCHROME | × | ○ | ○ | ○ | ○ | ○ |
| | COLOR | ○ | × | ○ | ○ | × | ○ |
| | SCALING | × | × | ○ | × | × | ○ |
| | ORIGINAL TYPE | ○ | ○ | ○ | ○ | × | ○ |

FIG. 3B

| JOB TYPE | | SETTING | COMPRESSION PROCESSING | | DECOMPRESSION PROCESSING | | RENDERING PROCESSING | |
|---|---|---|---|---|---|---|---|---|
| | | | COMPRESSION PROCESSING 1 | COMPRESSION PROCESSING 2 | DECOMPRESSION PROCESSING 1 | DECOMPRESSION PROCESSING 2 | RENDERING PROCESSING 1 | RENDERING PROCESSING 2 |
| COPY | | MONOCHROME | × | ○ | × | ○ | × | ○ |
| | | COLOR | ○ | × | ○ | × | ○ | × |
| | | SCALING | — | — | — | — | — | — |
| | | ORIGINAL TYPE | — | — | — | — | — | — |
| | | DOUBLE-SIDED PRINTING | — | — | — | — | — | — |
| PDL | | MONOCHROME | × | ○ | × | ○ | × | ○ |
| | | COLOR | ○ | × | ○ | × | ○ | × |
| | | SCALING | — | — | — | — | — | — |
| | | ORIGINAL TYPE | — | — | — | — | — | — |

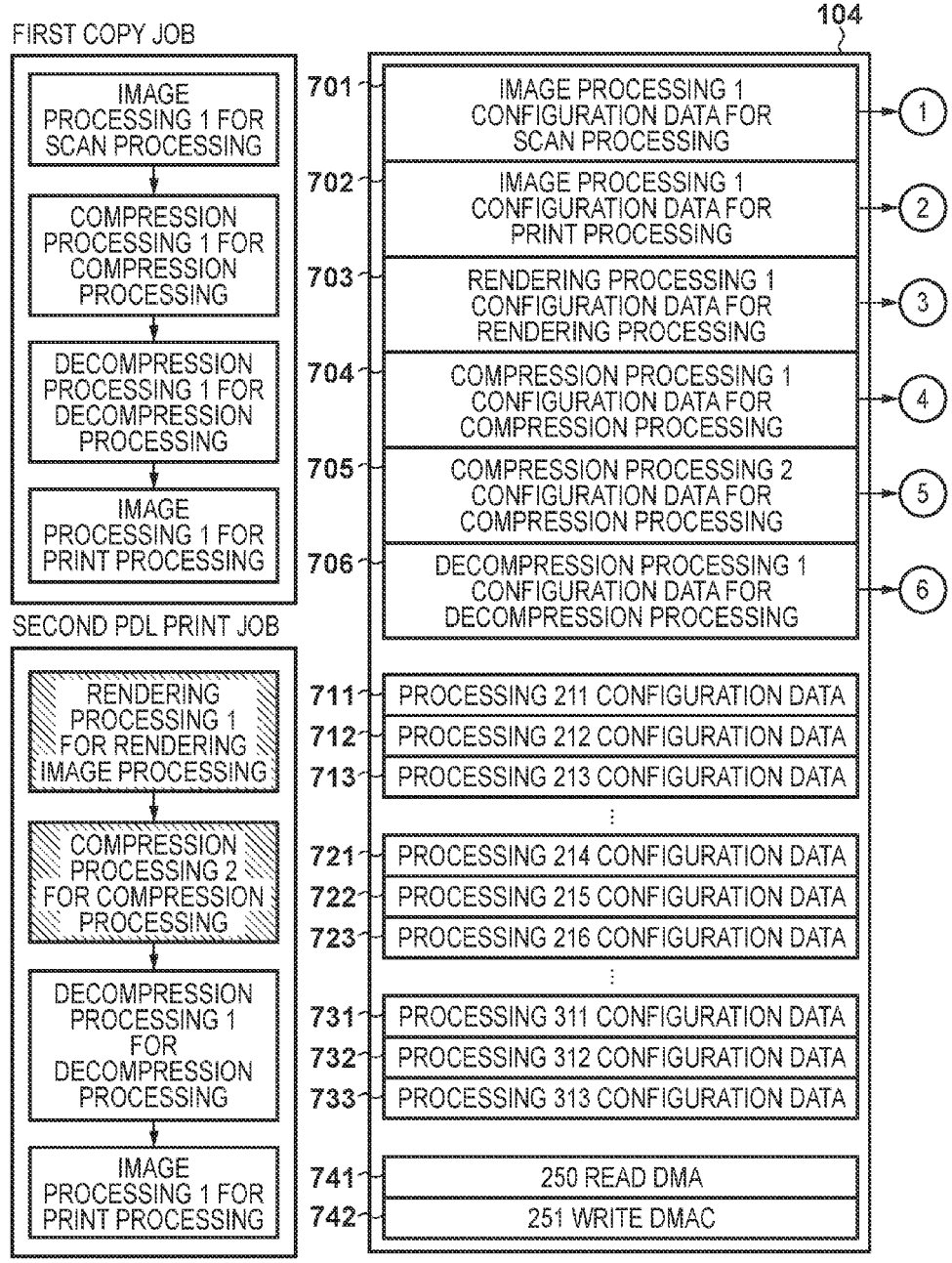

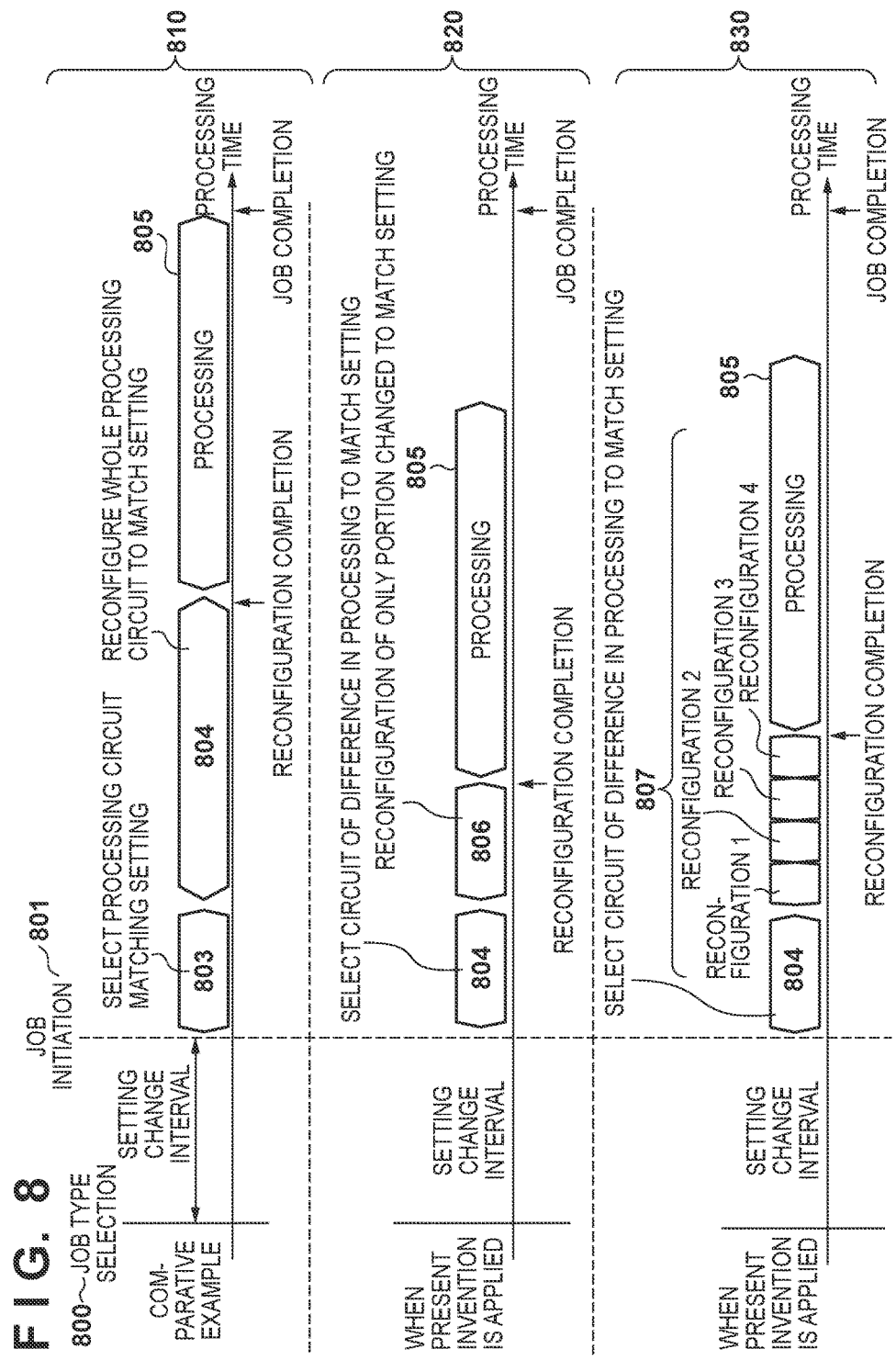

FIG. 10A

| JOB TYPE | SETTING | SCAN PROCESSING | | | PRINT PROCESSING | | |
|---|---|---|---|---|---|---|---|
| | | IMAGE PROCESSING 1 | IMAGE PROCESSING 2 | IMAGE PROCESSING 3 | IMAGE PROCESSING 1 | IMAGE PROCESSING 2 | IMAGE PROCESSING 3 |
| COPY | MONOCHROME | × | ○ | ○ | ○ | ○ | ○ |
| | COLOR | ○ | × | ○ | ○ | × | ○ |
| | SCALING FACTOR | × | × | ○ | × | × | ○ |
| | ORIGINAL TYPE | ○ | ○ | ○ | ○ | × | ○ |
| | DOUBLE-SIDED PRINTING | ○ | ○ | ○ | — | — | — |
| PDL | MONOCHROME | × | ○ | ○ | ○ | ○ | ○ |
| | COLOR | ○ | × | ○ | ○ | × | ○ |
| | SCALING FACTOR | × | × | ○ | × | × | ○ |
| | ORIGINAL TYPE | ○ | ○ | ○ | ○ | × | ○ |

FIG. 10B

| JOB TYPE | SETTING | COMPRESSION PROCESSING | | DECOMPRESSION PROCESSING | | RENDERING PROCESSING | |
|---|---|---|---|---|---|---|---|
| | | COMPRESSION PROCESSING 1 | COMPRESSION PROCESSING 2 | DECOMPRESSION PROCESSING 1 | DECOMPRESSION PROCESSING 2 | RENDERING PROCESSING 1 | RENDERING PROCESSING 2 |
| COPY | MONOCHROME | × | ○ | × | ○ | × | ○ |
| | COLOR | ○ | × | ○ | × | ○ | × |
| | SCALING FACTOR | — | — | — | — | — | — |
| | ORIGINAL TYPE | — | — | — | — | — | — |
| | DOUBLE-SIDED PRINTING | — | — | — | — | — | — |
| PDL | MONOCHROME | × | ○ | × | ○ | × | ○ |
| | COLOR | ○ | × | ○ | × | ○ | × |
| | SCALING FACTOR | — | — | — | — | — | — |
| | ORIGINAL TYPE | — | — | — | — | — | — |

FIG. 10C

| JOB TYPE | SETTING | WRITE DMAC PROCESSING | | | READ DMAC PROCESSING | | |
|---|---|---|---|---|---|---|---|
| | | LINE PROCESSING | RECTANGLE PROCESSING | LINEAR PROCESSING | LINE PROCESSING | RECTANGLE PROCESSING | LINEAR PROCESSING |
| COPY | MONOCHROME | × | ○ | × | × | ○ | × |
| | COLOR | ○ | × | × | ○ | × | × |
| | SCALING FACTOR | — | — | — | — | — | — |
| | ORIGINAL TYPE | — | — | — | — | — | — |
| | DOUBLE-SIDED PRINTING | — | — | — | — | — | — |
| PDL | MONOCHROME | × | ○ | × | ○ | ○ | × |
| | COLOR | ○ | ○ | × | × | ○ | × |
| | SCALING FACTOR | — | — | — | — | — | — |
| | ORIGINAL TYPE | — | — | — | — | — | — |

IMAGE PROCESSING APPARATUS INCLUDING CIRCUIT CONFIGURATION AND METHOD OF CONTROLLING THE SAME

TECHNICAL FIELD

The present invention relates to an image processing apparatus and a method of controlling the same.

BACKGROUND ART

A reconfigurable circuit such as a PLD (Programmable Logic Device) or an FPGA (Field Programmable Gate Array), which is capable of changing a configuration of a logic circuit, is well known. Generally, changing the logic circuit of the PLD or the FPGA is realized by writing circuit arrangement information stored in a non-volatile memory such as a ROM into a configuration memory which is a volatile memory within the PLD or the FPGA upon an activation. Also, because the information of the configuration memory is cleared upon a power disconnection, the circuit arrangement information stored in the ROM must be written in the configuration memory once again upon the power supply activation. An approach to configuring the logic circuit of a PLD or an FPGA only once in a state in which the power supply is being supplied in this way is referred to as a static reconfiguration. In contrast to this, FPGAs, or the like, that are able to change a configuration of a logic circuit dynamically while the logic circuit is in operation have been developed, and an approach to changing a logic circuit dynamically in this way is referred to as a dynamic reconfiguration.

Also, there are FPGAs capable of rewriting a circuit configuration of a particular region alone rather than the circuit configuration of the entire chip of the FPGA, and this kind of rewriting is referred to as a partial reconfiguration. In particular, changing another circuit configuration without causing the operation of a circuit that is in operation to stop is referred to as a dynamic partial reconfiguration. In a dynamic partial reconfiguration, by rewriting only a partial region of the configuration memory rather than rewriting the entire configuration memory upon the dynamic reconfiguration, it is possible to partially reconfigure an FPGA logic circuit. By employing such a dynamic partial reconfiguration, it is possible to implement a plurality of logic circuits that can be switched time-divisionally in the regions of the FPGA, for example. As a result, it is possible to flexibly realize various functions with few hardware resources while maintaining high speed computational capabilities of the hardware in accordance with intended uses.

However, even when the circuit configuration can be changed in-operation, the time required for changing (rewriting) the circuit configuration is long, and the time is proportional to the size of the logic circuit configuration information written in the configuration memory. Also, if there are many change locations in the circuit configuration, and changes in the circuits are performed independently for each of the change location circuits, a configuration will need to be performed for each change location, and the rewrite time required to complete the reconfiguration of the circuit on the whole will increase. In Japanese Patent Laid-Open No. 2012-234337, a technique for reducing rewrite times, in which processing having a high possibility of being processed next is predicted in image processing, and configuration data for realizing the predicted processing is loaded into high speed configuration memory in advance is disclosed. It is possible to reduce circuit configuration data load times in image processing and it is possible to allow for optimization of image processing speeds by loading into high speed configuration memory in advance.

Also, an image processing apparatus such as an MFP (MULTI FUNCTION PRINTER) is capable of selecting a plurality of jobs (a copy job, a print job, a SEND job, or the like) in accordance with a request from a user. Image processing corresponding to various processing is realized by hardware or software. In order to support function requests from a user, recent MFPs are equipped with large scale hardware for image processing supporting various functions, and it is possible to realize various functions by accepting detailed settings in accordance with various job content. However, function enhancements in the hardware for image processing corresponding to the contents of various jobs leads to cost increases in the hardware for image processing. Also, time is required to perform settings due to the settings for the hardware for image processing corresponding to the various job contents increasing in number. For this reason, the time required until job execution processing is initiated increases. Accordingly, there is a need to realize, by using reconfigurable circuits for an MFP image processing apparatus, a function corresponding to a requested job in a reconfigurable circuit without implementing all functions corresponding to the various job content is such a way that they are always in hardware.

However, there is a problem with the above described conventional technique as recited below. For example, when the reconfiguration technique in the above described conventional technique is applied to an image processing unit of an image processing apparatus, even though it is possible to change the circuit configuration in-operation, the changed processing circuit unit must match the interfaces of the peripheral circuits connected to the processing circuit unit. In particular, the data processing scheme in the interface must match. For example, if only the processing circuit unit by which performance of a rewriting of the circuit configuration is desired is changed, and the processing scheme for the data does not match that of the peripheral circuits, the processing circuit unit for which the rewriting is performed will not be able to operate normally.

A case of rectangle processing wherein the data processing units that the processing circuit unit, for which the rewriting is performed, handles are rectangular data is considered. As a matter of course, for the data units of the peripheral circuits connected to the processing circuit unit must also be handled as the same rectangle data. For example, if the processing circuit unit for which the rewriting is performed is line processing that handles data in a line form, the data processing scheme differs to that of the peripheral circuit connected to the processing circuit unit, and the scheme for transferring the processing data does not match. For this reason, there is a problem in that if a reconfiguration is not performed by determining a range within which it is necessary to perform the change for the circuit for which the rewriting is performed, the reconfigured circuit will not be able to execute correctly.

Furthermore, there is a problem in that for the time that is required for the change of the circuit configuration (the rewriting), if the execution time for rewriting takes longer, the time required to complete the job that the image processing apparatus executes will take that much longer. The time for the change of the circuit configuration is proportional to the size of the configuration data written in the configuration memory in the reconfigurable circuit. Also, if there are many change locations in the circuit configuration, and changes in the circuits are performed independently for each of the change location circuits, a configuration will need to be performed for each change location, and the rewrite time required to complete the reconfiguration of the circuit on the whole will increase. In approaches to optimizing rewrite times of configuration data in conventional techniques, even if the configuration data is loaded in advance, if the processing circuit rewrite count, or the configuration data size is large, the overall rewrite time cannot be shortened.

SUMMARY OF INVENTION

The present invention enables realization of an arrangement, in a reconfiguration unit for which a partial reconfiguration is possible, where in addition to being operable in a cooperative manner with functional blocks other than the functional block that is newly rewritten, which are portions which are not rewritten, the rewrite time for the reconfiguration is shortened.

One aspect of the present invention provides an image processing apparatus, comprising: a reconfiguration circuit for which a circuit configuration can be partially reconfigured; a storage unit configured to store in advance configuration data for each of a plurality of functional blocks for configuring the reconfiguration circuit; an accepting unit configured to accept a job; a specification unit configured to specify a difference between a circuit configuration for processing the job accepted by the accepting unit and a circuit configuration already configured in the reconfiguration circuit; a selection unit configured to select, based on the specified difference, a functional block to be reconfigured in the reconfiguration circuit; and a reconfiguration unit configured to, based on the functional block selected by the selection unit, reconfigure the reconfiguration circuit by reading configuration data from the storage.

Another aspect of the present invention provides a method of configuring, using configuration data stored in a storage unit, a functional block, that corresponds to the configuration data, in a reconfiguration circuit for which a circuit configuration can be partially reconfigured, comprising: accepting a job; specifying a difference between a circuit configuration for processing the accepted job and a circuit configuration already configured in the reconfiguration circuit; selecting, based on the specified difference, a functional block to be reconfigured in the reconfiguration circuit; and based on the selected functional block, reconfiguring the reconfiguration circuit by reading configuration data stored by the storage unit.

Further features of the present invention will be apparent from the following description of exemplary embodiments with reference to the attached drawings.

BRIEF DESCRIPTION OF DRAWINGS

FIG. 1 is a block diagram for showing an example of a configuration of an image processing apparatus according to a first embodiment.

FIG. 2 is a view for showing an operation unit accepting a job from a user of the image processing apparatus according to the first embodiment.

FIGS. 3A and 3B are views for explaining a relationship between jobs accepted by the image processing apparatus according to the first embodiment and corresponding processing functions.

FIGS. 7A and 7B are views for explaining a configuration data transition of the image processing apparatus according to the first embodiment.

FIG. 8 is a timing chart representing an effect of shortening the time required until a job execution when the present invention according to the first embodiment is adopted.

FIGS. 10A to 10C are views for explaining a relationship between jobs accepted by the image processing apparatus according to the second embodiment and corresponding processing functions.

DESCRIPTION OF EMBODIMENTS

Figure 4:
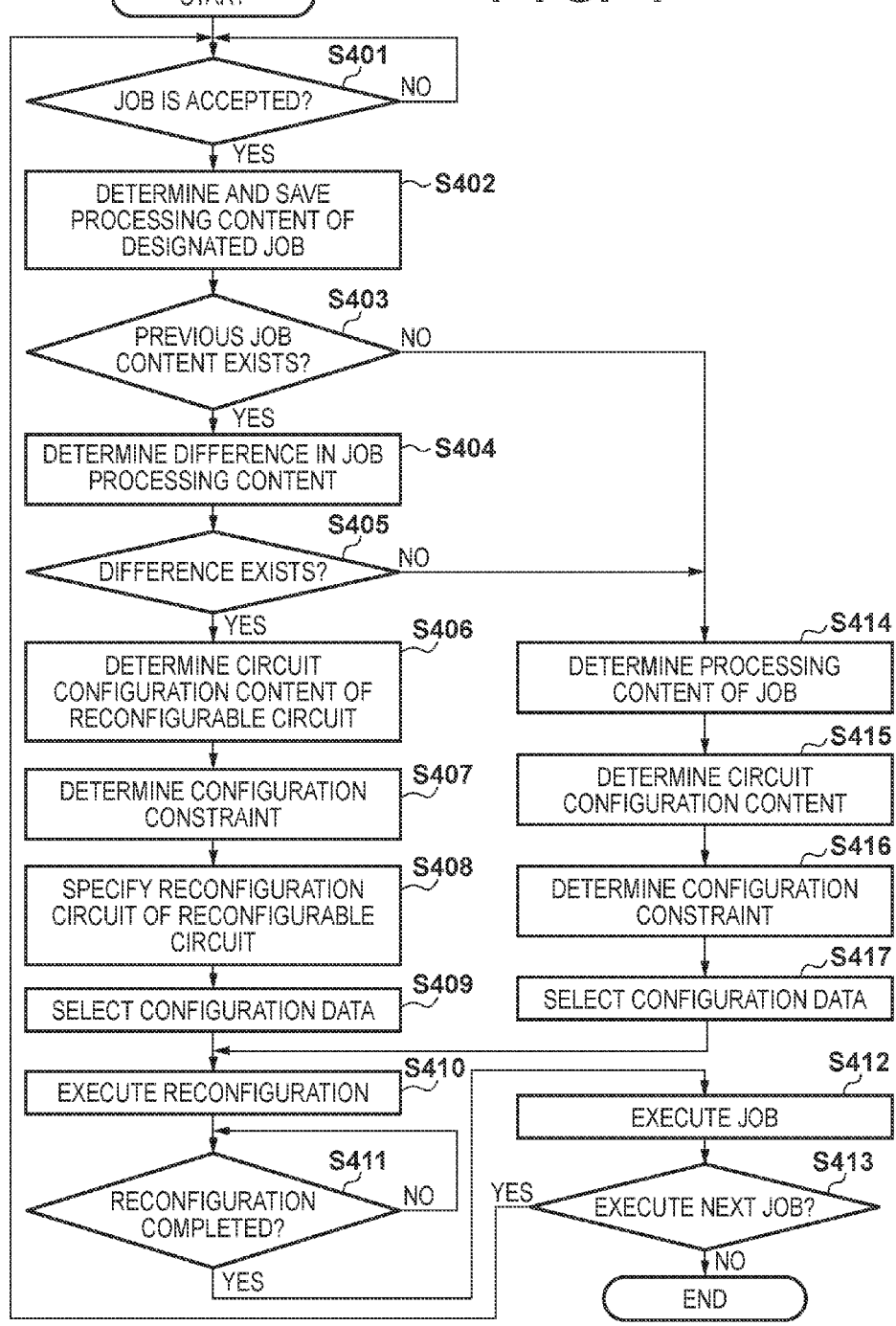
FIG. 4 is a flowchart for representing control for reconfiguration of an image processing unit upon a setting change of the image processing apparatus according to the first embodiment.

Embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

<Image Processing Apparatus Configuration>

Below, with reference to FIG. 1 through FIG. 8 explanation will be given for a first embodiment of the present invention. Firstly, FIG. 1 is a block diagram for explaining a device configuration of an image processing apparatus relating to embodiments of the present invention. In the present embodiment, explanation will be given for a case in which an image processing apparatus 100 is a multi-function peripheral (multifunction processing apparatus) having a scanner unit and a printer unit.

The image processing apparatus 100 comprises an operation unit 103 for a user that uses the image processing apparatus 100 to perform various operations, a scanner unit 109 that reads image information of an original, and a printer unit 107 that prints an image onto a sheet based on image data. The scanner unit 109 comprises a CPU for controlling the scanner unit 109, and an illumination lamp and a scanning mirror for performing a read of an original. The printer unit 107 comprises a CPU for controlling the printer unit 107, and a photosensitive drum and a fixing device for performing image formation (printing) and fixation. The operation unit 103 has a power saving key, and when the power saving key is pressed, transition into a power saving state or return from the power saving state is performed.

Also, the image processing apparatus 100 comprises an FPGA 140 equipped with a dynamic reconfiguration unit which is a controller for controlling the image processing apparatus 100. In this example, the FPGA 140 is equipped with a CPU 101 which comprehensively controls the operation of the image processing apparatus 100. The CPU 101 executes programs for controlling the FPGA 140 or a configuration controller 130 which controls reconfiguration. Note that the FPGA 140 being provided with the CPU 101 is only one example, and a CPU may also be provided externally to the FPGA 140.

Also, the image processing apparatus 100 comprises a boot program executed by the CPU 101 and a ROM (first storage unit) 104 where logic circuit configuration information for configuring the FPGA 140 is stored. Also, the image processing apparatus 100 comprises a RAM (second storage unit) 111 which is a system work memory for the CPU 101 to operate, and an image memory into which image data is temporarily stored. Also, the RAM 111 is a memory into which a duplication of logic circuit configuration information stored in the ROM 104 is stored, so that it can be read at high speed.

The FPGA 140 is equipped with the CPU 101, a network I/F 102, a printer I/F 106, a scanner I/F 108, a memory controller 110, a ROM I/F 112, an operation unit I/F 113, a USB I/F 114, a FAX I/F 115, the configuration controller 130, and a dynamic reconfiguration unit (reconfiguration circuit) 131. The reconfiguration unit 131 is a circuit group comprised of a logic circuit for which reconfiguration is possible, and is a circuit group for which a dynamic reconfiguration is possible and a partial reconfiguration is possible. In other words, when a circuit reconfigured in a portion of the reconfiguration unit 131 is operating, it is possible to reconfigure another circuit in a separate portion that does not overlap the portion that the circuit covers. The reconfiguration unit 131 comprises an image processing unit A 132, an image processing unit B 133, an image processing unit C 134, and an image processing unit D 135, where a logic circuit for performing each kind of image process can be reconfigured partially. Note that an embodiment is shown in a case where the number of the image processing units comprised in the reconfiguration unit 131 is 4 in the present embodiment, but the plurality of image processing units comprised in the reconfiguration unit 131 is not limited to 4 image processing units. The configuration controller 130 controls a circuit configuration (a configuration) of the reconfiguration unit 131.

Image data is input into the scanner I/F 108 from the scanner unit 109. Image data is output to the printer from the printer I/F 106. The reconfiguration unit 131, the scanner I/F 108, and the printer I/F 106 are connected to an image bus 121 for transferring image data to be processed.

The CPU 101 controls operation of the image processing apparatus 100 comprehensively, and performs communication (transmitting/receiving) with a general-purpose computer on a network through the network I/F (network interface) 102. Also, the CPU 101 performs a communication (transmitting/receiving) with a general-purpose computer connected to the image processing apparatus 100 through the USB I/F (USB interface) 114. Also, the CPU 101 performs communication (transmitting/receiving) with another image processing apparatus or a facsimile apparatus by connecting to a telephone public circuit network through the FAX I/F (facsimile interface) 115. There is a CI detection circuit for detecting a call signal (a CI signal: Call Indicator) from a telephone public circuit network in the FAX I/F 115. The ROM I/F 112 controls writing and readout operations on the ROM 104 in which a boot program that the CPU 101 executes and logic circuit configuration information (configuration data) for configuring the reconfiguration unit 131 are stored.

Also, the FPGA 140 comprises a system bus 120 over which the CPU 101, the network I/F 102, the operation unit 103, the ROM I/F 112, the configuration controller 130, and the reconfiguration unit 131 are connected with each other. The CPU 101 performs parameter setting of each image processing unit (132, 133, 134, and 135) configured in the reconfiguration unit 131, the scanner I/F 108, and the printer I/F 106 through the system bus 120. The RAM 111 is a system work memory for the CPU 101 to operate, and is also an image memory for temporarily storing image data, and also the RAM 111 is a memory into which a duplication of logic circuit configuration information stored in the ROM 104 is stored, so that it can be read at high speed. The memory controller 110 controls write and readout operations on the RAM 111. The memory controller 110 is connected to the system bus 120 and the image bus 121, and exclusively switches between access of the bus master RAM 111 connected to the image bus 121, and access of the bus master RAM 111 connected to the system bus 120.

<Operation Unit>

Next, explanation will be given for a transition for items displayed on the operation unit 103 of the image processing apparatus 100 according to the present embodiment and items displayed accompanying a setting item change by a user with reference to FIG. 2. In the present embodiment, the operation unit 103 is configured using a liquid crystal screen and a touch panel. The present invention is not limited to this, of course, another alternative configuration may be applied to the operation unit 103.

Reference numeral 231 in FIG. 2 shows a UI (User Interface) screen displayed on the operation unit 103 when a power supply activation of the image processing apparatus 100 is performed, or an operation to return from a sleep state for a power saving is performed by a user. Normally, a main menu screen 200 is displayed after a power supply activation or a return from sleep. A hierarchical display unit 201 for showing a current menu hierarchy to the user is displayed on the main menu screen 200. Also, job selection icons 202-204 for selecting a job which can be executed by the image processing apparatus 100 are displayed on the main menu screen 200. The job selection icons 202-204 represent a copy job, a FAX job, and a SEND job respectively. Note that jobs which can be processed by the image processing apparatus 100 are not limited to those of the example shown in reference numeral 231.

Reference numeral 232 in FIG. 2 denotes a copy setting screen 210 displayed after a user selects a copy job selection icon 202 on the main menu screen 200. On the copy setting screen 210, a setting value display unit 211 for displaying current basic setting values in a list is displayed. On the setting value display unit 211, a status notification unit 212 for notifying a user whether or not the image processing apparatus 100 can currently start a job is displayed. Also, on the setting value display unit 211, whether or not an original is read in color or monochrome, a scaling factor, a sheet size, the number of copies to be output, or the like are displayed in a list as basic setting values. On the copy setting screen 210, setting change icons 213-220 for changing various settings values that are frequently used are displayed. The icons include an original read color selection icon 213, a scaling icon 214 for changing a scaling factor, a paper selection icon 215 for changing a paper type, and a number of copies icon 216 for changing the number of copies.

Also, on the copy setting screen 210, an original type setting icon, for setting whether an original type includes only a photograph, a photograph and text, or only text, is displayed. Also, on the copy setting screen 210, a page aggregation setting icon for setting to output a plurality of originals that are read by the scanner unit 109 collectively on one page is displayed. Also, on the copy setting screen 210, a frame delete setting icon 319 for deleting an unnecessary region included in a margin of an original is displayed. Also, on the copy setting screen 210, a double-sided print setting icon 220 for switching whether or not an image is printed on both sides (front and back) of a sheet in the printer unit 107 is included. Also, on the copy setting screen 210, an other functions settings icon 221 for changing other setting items that are not displayed on the screen is displayed. Also, a copy start icon 222 for instructing a copy operation start to the image processing apparatus 100 is displayed.

Note that the setting items for a copy job and setting change icons 213-221 displayed on the copy setting screen 210 are not limited to those shown in reference numeral 232 in the present embodiment. As shown in reference numeral 232, the most frequently used setting values are already set as default settings of the copy job immediately after a copy job selection icon 202 is selected on the main menu screen 200. Note that the default setting values shown here are not limited to what is shown in reference numeral 232.

Reference numeral 233 in FIG. 2 is showing a screen displayed on the operation unit 103 after each a setting change is performed by a user on the copy setting screen 210 in reference numeral 232. In the example of 233, settings are changed to 80% for the scaling factor, photograph for the document type, and yes for double-sided printing respectively. In order to notify the user that the setting values are changed, the display color of the icons, or the like, is changed for setting change icons 214, 217 and 220 whose settings are changed. In this state, by selecting the copy start icon 222, the image processing apparatus 100 starts a copy job based on the values set by the user.

In the present embodiment, in a case where the copy job selection icon 202 is selected in reference numeral 231, the configuration of reference numeral 201 in FIG. 2 which are default setting image processing functions for copy jobs is configured in the reconfiguration unit 131. In other words, configuration data for realizing a configuration of the image processing functions in reference numeral 201 stored on the ROM 104 is appropriately transferred to the reconfiguration unit 131 by the configuration controller 130, and configured (configuration). Note that configuration data that was duplicated on the RAM 111 in advance may be read rather than reading the configuration data from the ROM 104 directly.

In a case where a PDL print processing job is requested of the image processing apparatus 100 by the network after the copy job processing is executed by reference numeral 233 in FIG. 2, image processing for scanning configured in an image processing unit 132 is immediately reconfigured to be image processing for rendering. Additionally, this is not limited to the copy job; in a case where an execution setting of a job accepted by the image processing apparatus 100 is changed, the corresponding image processing unit (not shown) is reconfigured into the reconfiguration unit 131 as necessary. Upon a reconfiguration due to a change in the processing content of a job, for portions for which there is no change in the configuration of the processing content from a previously accepted job, the circuit configurations of each image processing configuration unit of the reconfiguration unit 131 are held as is.

<Relationship of Jobs to Processing>

Next, a relationship between each kind of job that the image processing apparatus 100 accepts by the operation unit 103 and processing executed on the reconfiguration unit 131 that corresponds to these is described with reference to FIGS. 3A and 3B. Each type of job and setting shown in FIGS. 3A and 3B correspond to a type of a job and a setting of the job set by the operation unit 103 in FIG. 2. Processing groups (functional blocks) which can support respective kinds of jobs are broadly divided into scan processing, print processing, compression processing, and decompression processing. Of course there is processing other than this, and processing circuits for performing a reconfiguration similarly according to settings are prepared.

For the processing groups shown in FIGS. 3A and 3B, processing is further divided by which individual settings that the processing can support. For the scan processing, 3 processing configurations (image processing 1, image processing 2, and image processing 3 for scan processing) are prepared. The processing where a circle is indicated as shown in FIGS. 3A and 3B corresponds to processing which can support the selected job content.

In the example selected in FIG. 2, when the copy job is accepted for the first time, the functions corresponding to the copy processing in the job type shown in FIGS. 3A and 3B become a processing group which can be selected by the reconfiguration unit 131. Next, from the copy job, a processing group corresponding to the setting items shown in FIGS. 3A and 3B is selected according to each setting set in the copy setting screen 210. For example, in a case where color selection 213 on the copy setting screen 210 is operated, a processing group which corresponds to the color setting item shown in FIGS. 3A and 3B, and can support the color setting item (circle) is a processing configuration which can be selected by the reconfiguration unit 131. Note that it is advantageous that a table defining the content of the table shown in FIGS. 3A and 3B is stored in the ROM 104 or the like in advance. That is, the image processing apparatus 100 can refer to the above described table stored in the ROM 104 in accordance with the selection or settings inputted through the operation unit 103, and further can determine the functional block to be reconfigured according to later explained control.

<Reconfiguration Control Sequence>

Next, a processing procedure for performing a reconfiguration of the reconfiguration unit 131 according to a job accepted by the operation unit 103 is described with reference to FIG. 4. Processing explained below is realized by the CPU 101 executing a control program stored in the ROM 104 on the RAM 111.

In step S401, the CPU 101 functions as accepting unit and determines whether or not there is a job acceptance in the operation unit 103. In a case where a job is accepted, transition is made to step S402. In step S402, the CPU 101 stores the processing content of the job designated in step S401 on the RAM 111, and determines the processing content requested by the job. For example, in a case where the copy job selection icon 202 is selected, the CPU 101 determines each process of the scan image processing and print image processing required for the copy processing and the setting parameters required for the each process.

Next, in step S403, the CPU 101 determines whether or not a job accepted from the operation unit 103 before the accepted job exists. The determination of whether or not the previous job acceptance exists is realized by the CPU 101 confirming the content of the previous job stored on the RAM 111. The CPU 101 read accesses the region in the RAM 111 storing the job content, and in a case where the data of the previous job exists, transition is made into step S404. In a case where data of the previous job is not stored, it is determined that the received job is the first job after power supply activation or return from sleep, and transition is made into step S414.

In step S404, the CPU 101 determines the difference between the processing content of the previous job and the processing content of the current accepted job. The CPU 101 determines which processing is changed from the previous job, and the changed, added, or deleted processing content is extracted (specified). Then, in step S405, the CPU 101 determines whether or not there is processing content that changed from the result of the determination in step S404. In a case where there is changed processing content, transition is made into step S406, and in a case where there is no change/difference, it is determined to be the processing content of the same job, and transition is made into step S414.

In step S406, the CPU 101 specifies the circuit configuration to perform the reconfiguration of the image processing configuration units 132, 133, 134 and 135 based the previously described processing content for the difference between the jobs. The CPU 101 determines the circuit configuration to support the processing for the difference between the jobs. After the circuit configuration required for change is determined, the CPU 101 determines whether or not there is a constraint condition upon performing the reconfiguration in step S407. For example, in a case where processing performance of the image processing apparatus 100 between the jobs is considered to be important, and the time spent for a reconfiguration into a circuit for which the reconfiguration is performed is minimized, a rewrite count of the circuit configuration is minimized. Alternatively, a minimum rewrite time is selected.

In step S408, the CPU 101 specifies the circuit configuration for performing the reconfiguration according to the constraint condition determined in step S407. The CPU 101 determines the circuit configuration required for executing the job, which satisfies the above described constraint condition upon performing the reconfiguration. Then, the configuration controller 130 extracts (specifies) the configuration data corresponding to the circuit configuration to be reconfigured from the configuration data stored in advance on the ROM 104, the RAM 111, or the like, in step S409. Regarding this configuration data, a single reconfiguration may be executed by selecting a plurality of configuration data items in fine processing units according the circuit configuration for which the reconfiguration is performed. Alternatively, the processing units for performing the reconfiguration may be set to be larger, and one the reconfiguration may be executed by configuring a smaller number of configuration data items. That is, a unit of a module for which the reconfiguration is performed may correspond to a functional block, or may correspond to a unit into which a functional block is divided. The selection of the configuration data for performing the reconfiguration is included in the constraint condition in the above described step S407 and step S408.

Next, in step S410, the configuration controller 130 uses configuration data selected in step S409 and reconfigures the reconfiguration unit 131. Reconfiguration is realized by rewriting the circuits of the image processing configuration units (132, 133, 134 and 135) of the reconfiguration unit 131 according to the configuration data. When reconfiguration of the reconfiguration unit 131 is completed, in step S411 the configuration controller 130 makes an interrupt notification that reconfiguration is completed. In step S412 the CPU 101 receives the interrupt notification of step S411 that reconfiguration is completed, and executes the accepted job. After job execution, in step S413, the CPU 101 performs a determination as to whether the next job is accepted, and when an acceptance of the next job occurs, processing transitions to step S401 and job processing is performed.

On the other hand, in step S403, if it is determined that the content of the previous job is not stored, or it is determined that there is no difference in step S405, the processing transitions to step S414. In step S414, the CPU 101 determines the processing content of the job, and selects all processes needed to execute the job. Then, in step S415 the CPU 101 specifies a circuit configuration comprised in an image processing configuration unit (132, 133, 134, or 135), according to the processing content selected in step S414. In step S416, the CPU 101, after determining the necessary circuit configuration, determines whether or not there is a constraint condition for performing the configuration. Then, in step S417, the configuration controller 130 extracts (specifies) the configuration data corresponding to the circuit configuration to be reconfigured from the configuration data stored in advance on the ROM 104, the RAM 111, or the like. After this, the processing transitions to step S410 and reconfiguration is executed. Since the processes hereinafter are the same as explained above, explanation will be omitted.

<Example Configuration of Image Processing Circuit that is Configured in Reconfiguration Unit>

Next, with reference to FIG. 5 and FIG. 6, an explanation will be given of the relationship between configuration data and an image processing function (a functional block) that is configured in the reconfiguration unit 131 which is switched in accordance with the job content for the image processing apparatus 100 corresponding to the present embodiment. The image processing apparatus 100 includes a function for copying an original that is read by the scanner unit 109 (copy job), and a function for printing print data that is delivered from an external print driver (PDL print job). Also, the image processing apparatus 100 has a function for printing FAX data received from the FAX I/F 115 (a FAX job). Also, it includes a SEND job for transmitting image data of an original that is read by the scanner unit 109, to an external general-purpose computer through the network I/F 102. In the case of an image processing system to which a dynamic reconfiguration technique is applied, the required image processing function is configured in the reconfiguration unit 131 in accordance with the functions selected by a user and changed setting items, and actual processing is performed.

Figure 5:
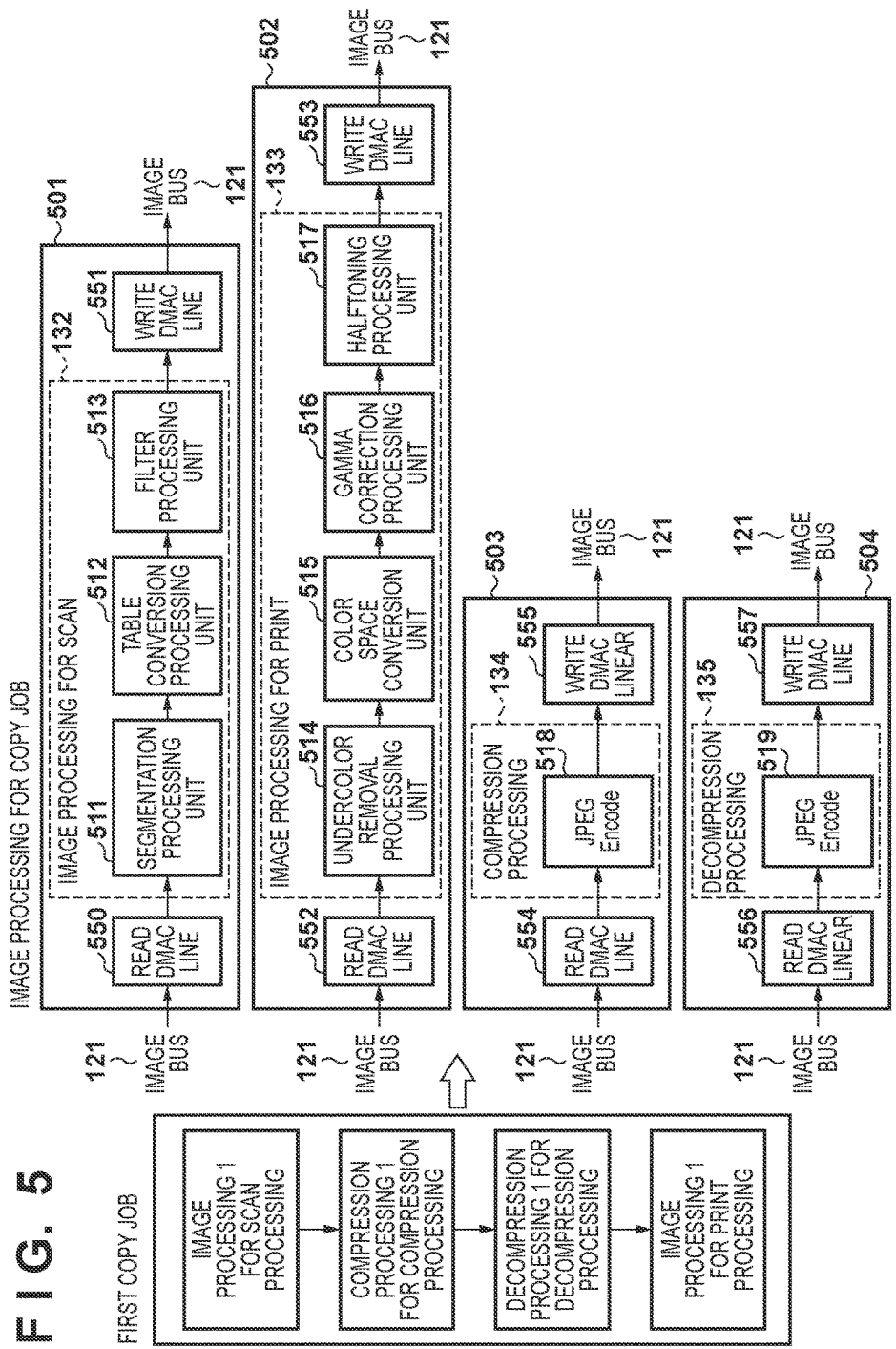
FIG. 5 is a view for explaining functions of the image processing apparatus according to the first embodiment and image processing functions comprised in reconfiguration units.

In FIG. 5, a state of image processing functions that, having accepted a first job, are configured on the reconfiguration unit 131 to process the job is shown. In FIG. 5, a case wherein a copy job is accepted from the operation unit 103 as the first job is shown. For the processing content performed on the reconfiguration unit 131 in a case that a copy job is accepted, there is a need for image processing for scanning as processing for reading an original, and image processing for printing as image processing for printing out. Also, there is a need for compression processing (encoding processing) for image data for which image processing for scanning is performed, and decompression processing (decoding processing) which decompresses compressed data before executing image processing for printing.

Image data of an original read at the scanner unit 109 is stored from the image bus 121 to the RAM 111 as a copy job via a scan I/F 108. Continuing on, the image data stored in the RAM 111 is read out via the image bus 121 by a read direct access memory controller (DMAC: Direct Access Memory Controller) 550. Image processing for scanning is performed on the read out image data, and image data of the processing result is written back to the RAM 111 by a write DMAC 551. The image processing function that realizes the above-described process content corresponds to the circuit configuration that is shown in reference numeral 501 of FIG. 5. Here, the data processing schemes of the read DMAC 550, the write DMAC 551 and the image processing for scanning are all line processing.

Next, the image data for which image processing for scanning which is stored in the RAM 111 was performed is read out by a read DMAC 554, and compression processing is performed. Data that has had compression processing performed on it is of a format of compressed continuous data which is different from line image data. Here, this continuous data format is represented as linear processing. A write DMAC 555 writes back the linear processing data for which compression processing was performed to the RAM 111. The image processing function that realizes the above-described process content corresponds to the circuit configuration that is shown in reference numeral 503 of FIG. 5.

Next, the compressed data that is stored in the RAM 111 is read out by a read DMAC 556 and decompression processing is performed. Data for which decompression processing has been performed is output as line form image data and is of a line processing format. A write DMAC 557 writes back the linear processing data for which decompression processing was performed to the RAM 111. The image processing function that realizes the above-described process content corresponds to the circuit configuration that is shown in reference numeral 504 of FIG. 5.

Next, line processing image data that is stored in the RAM 111 is read out through the image bus 121 by a read DMAC 552. Image processing for printing is performed on the read out image data, and image data of the processing result is written back to the RAM 111 by a write DMAC 553. Finally, the image data that is stored in the RAM 111 is output to the printer unit 107 by the printer I/F 106 via the image bus 121. The image processing function that realizes the above-described process content corresponds to the circuit configuration that is shown in reference numeral 502 of FIG. 5.

Each of the image processing configuration units 132, 133, 134 and 135 includes a processing function for performing image processing according to the read DMAC, write DMAC and job content of each image data item. In the example of FIG. 5, the circuit configuration 501 comprises an image processing configuration unit 132 which receives a first job, a processing circuit of the read DMAC 550, the write DMAC 551, and image processing for scanning. The circuit configuration 502 comprises an image processing configuration unit 133, the read DMAC 552, the write DMAC 553, and a processing circuit for an image processing for printing. The circuit configuration 503 comprises an image processing configuration unit 134, the read DMAC 554, the write DMAC 555, and a processing circuit 518 for compression processing. The circuit configuration 504 comprises an image processing configuration unit 135, the read DMAC 556, the write DMAC 557, and a processing circuit 519 for decompression processing.

Image processing for scanning includes a segmentation processing unit 511, a table conversion processing unit 512 and a filter processing unit 513. The image processing for printing includes an undercolor removal processing unit 514, a color space conversion unit 515, a gamma correction processing unit 516 and an error diffusion processing unit 517. The segmentation processing unit 511 determines an image region by detecting a character region from an input image, and afterwards generates an image region signal which is used in image processing. The table conversion processing unit 512 performs table conversion for transforming read image data that is luminance data into density data. The filter processing unit 513 performs computational processing with a digital spatial filter based on an objective such as, for example, edge emphasis or the like. The undercolor removal processing unit 514 performs processing for removing a background color in the case that image data that is read in from an original that has a light color as a background is sent. The color space conversion unit 515 performs CMYK conversion of RGB data in accordance with output characteristics of the image processing apparatus. The gamma correction processing unit 516 performs density conversion of image data. By comparing the input image data with a predetermined threshold, halftoning processing 517 performs conversion into N values, and diffuses into surrounding pixels, to which conversion into N values is processed thereafter, a difference from the threshold value and the current input image data.

Image data for which the foregoing image processing has finished is transferred to the printer I/F 106 via the image bus 121 and output from the printer unit 107. The above described flow is only one example, and it is also possible to execute processing by configuring another image processing function in the reconfiguration unit 131.

An explanation will be given for a case when the image processing apparatus 100 receives a PDL print process as a second accepted job. The second job is the next job accepted from the operation unit 103 after executing processing for the first job by the reconfiguration unit 131. FIG. 6 shows a state of the image processing functions that are configured on the reconfiguration unit 131 for processing the second job.

In the case when PDL print processing is accepted, as content of processing that is performed on the reconfiguration unit 131, rendering image processing for PDL, and image processing for printing out as image processing for printing is required. Also, there is a need for compression processing for image data for which rendering image processing for PDL has been performed (encoding processing), and decompression processing (decoding processing) which decompresses the compressed data before executing image processing for printing.

PDL data that is accepted from the network I/F 102 after receiving a PDL print processing job, is stored in the RAM 111. Continuing on, image data that is stored in the RAM 111 is read out through the image bus 121 by a read DMAC 650. Rendering processing, rotation processing based on a printing direction, and filtering processing is performed on the read out PDL data and image data of the processing result is written back by a write DMAC 651 to the RAM 111. The image processing function that realizes the above-described process content corresponds to the circuit configuration that is shown in reference numeral 601 of FIG. 6. Here, the data processing schemes of the read DMAC 650, the write DMAC 651 and the image processing for rendering are all rectangle processing.

Next, the image data for which image processing for rendering which is stored in the RAM 111 was performed is read out, and compression processing is performed by a read DMAC 652. Data that has had compression processing performed on it is of a compressed linear processing format which is different from the rectangular image data. A write DMAC 563 writes back the linear processing data for which compression processing was performed to the RAM 111. The image processing function that realizes the above-described process content corresponds to the circuit configuration that is shown in reference numeral 603 of FIG. 6.

Next, the compressed data that is stored in the RAM 111 is read out by the read DMAC 556 and decompression processing is performed. Data for which decompression processing has been performed is output as line form image data and is of a line processing format. The write DMAC 557 writes back the linear processing data for which the decompression processing was performed to the RAM 111. The image processing function that realizes the above-described process content corresponds to the circuit configuration that is shown in reference numeral 604 of FIG. 6.

Next, image data that is stored in the RAM 111 is read out through the image bus 121 by the read DMAC 552. Image processing for printing is performed on the read out image data, and image data of the processing result is written back to the RAM 111 by the write DMAC 553. Finally, the image data which is stored in the RAM 111 is output by the printer I/F 106 to the printer unit 107. The image processing function that realizes the above-described process content corresponds to the circuit configuration that is shown in reference numeral 602 of FIG. 6.

Each of the image processing configuration units 132 and 133 comprises the read DMAC 650, the write DMAC 651, and a processing function for performing image processing on image data according to job content. In the example of FIG. 6, a processing circuit of the read DMAC 650, the write DMAC 651, and the image processing for rendering are comprised in the image processing configuration unit 132 which receives a second job. In the image processing configuration unit 133, the read DMAC 552, the write DMAC 553, and a processing circuit for the image processing for printing are comprised. Additionally, as explained below, in the example of FIG. 6, the image processing configuration unit 133 re-uses the circuit configuration of a previous job as is.

Figure 6:
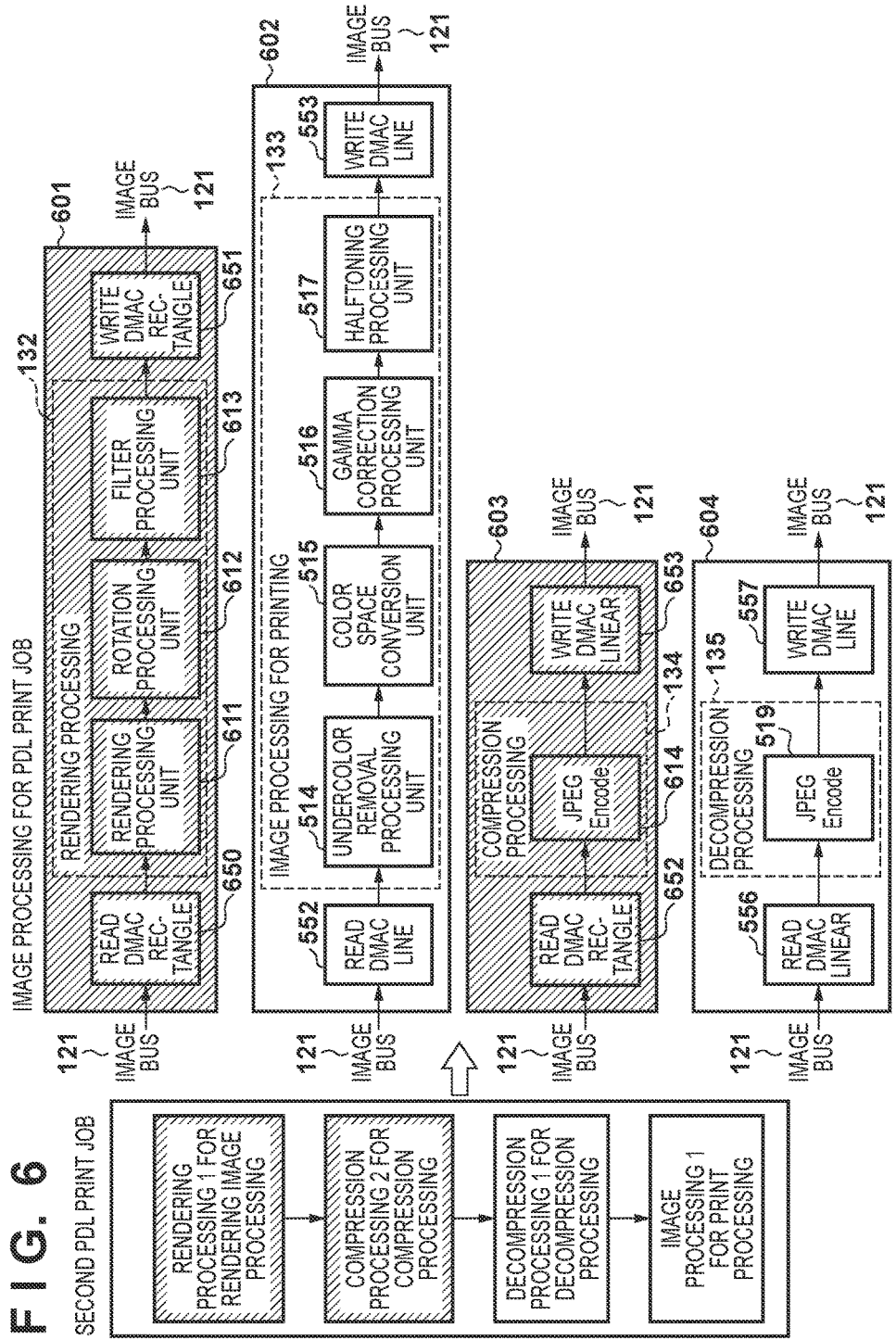
FIG. 6 is a view for explaining functions of the image processing apparatus according to the first embodiment and image processing functions comprised in reconfiguration units.

The processing configuration shown in FIG. 6 is a reconfiguration of the image processing configuration units 132, 133, 134 and 135 based on a result determined from a difference between job processing of a first job and a second job. Comparing to the configuration in FIG. 5, the image processing configuration unit 132 that forms a processing configuration of image processing for scanning is reconfigured by the image processing configuration for rendering processing. Also, the processing format of an image configuration unit 134 that performs compression processing changes from a line processing input to a rectangle processing input. In response to this, the image processing configuration unit 133 that forms a processing configuration of the image processing for printing and the image processing configuration unit 135 that performs decompression processing are not reconfigured as there is no need for a change in their processing.

Image processing for rendering processing includes a rendering processing unit 611, a rotation processing unit 612, and a filter processing unit 613. The rendering processing unit 611 generates image data from PDL data. The rotation processing unit 612 performs image rotation on a generated image data in accordance with a setting of a print direction. The filter processing unit 613 performs filtering processing on the image data.

In the present embodiment, reconfiguration is performed within the configuration unit 131 for a circuit configuration of image processing for rendering processing and a circuit configuration of compression processing that correspond to the differences in the processing between the first job and the second job. Image processing for printing and decompression processing, which are needed for the second job content, are realized by maintaining the circuit configurations of the image processing configuration units 133 and 135. In contrast to this, the second job does not require image processing for scanning. For this reason, the configuration of image processing for scanning is rewritten by a configuration of image processing for rendering processing. Also, since the processing format of compression processing for the first and second jobs differs in that one is rectangle processing and the other is line processing, the configurations of the DMACs and the compression processing are rewritten. In this way, by reconfiguring in the configuration unit 131 only differences in processing between the first job and the second job, the processing time for performing reconfiguration is reduced.

By virtue of the present embodiment, image processing is executed by configuring the image processing functions explained using in FIG. 5 and FIG. 6 as appropriate in the reconfiguration unit 131. Note that jobs which can be processed by the image processing apparatus 100 are not limited to those of the example shown in FIG. 5 and FIG. 6. Also, the processing units of the image processing are not limited to what is shown in FIG. 5 and FIG. 6, and it is possible to configure the circuit configuration having further divided the processing units included in each image process into a finer granularity (components).

<Configuration Data Configuration>

Next, referring to FIGS. 7A and 7B, an explanation will be given for a configuration of configuration data (configuration data). A configuration may be taken with the processing units described in FIG. 5 and FIG. 6 or a configuration may be taken with other units for configuration data for performing reconfiguration. For example, a single configuration data item may be prepared to include all of a read DMAC, each type of image processing unit, and a write DMAC. Also, a write DMAC, a read DMAC and each image processing unit may be prepared as separate configuration data items. Configuration data into which the image processing units 511-513 for image processing for scanning are individually divided may be prepared. The same applies to the image processing units 514-517 for the image processing for printing. The same applies to the image processing units 611-613 for the rendering processing. In a case where configuration data is prepared separately, in order to execute each job, it is possible to configure circuits needed for executing jobs by performing the partial reconfiguration of the respective above described separate configuration data items in the reconfiguration unit 131.

According to the present embodiment, configuration data of a circuit which is configured on the reconfiguration unit 131 is stored in advance in the ROM 104. As the configuration units for configuration data, the configuration data 701, 702, 703, 704 and 706 comprise one previously described configuration which includes a read DMAC, various image processing units that support it, and a write DMAC. The configuration data 711-742 are a configuration comprising the various image processing units 211-219 and 311-314 which are of a more detailed granularity than previously described, the read DMAC 550, and the write DMAC 551 separately.

Figure 7B:
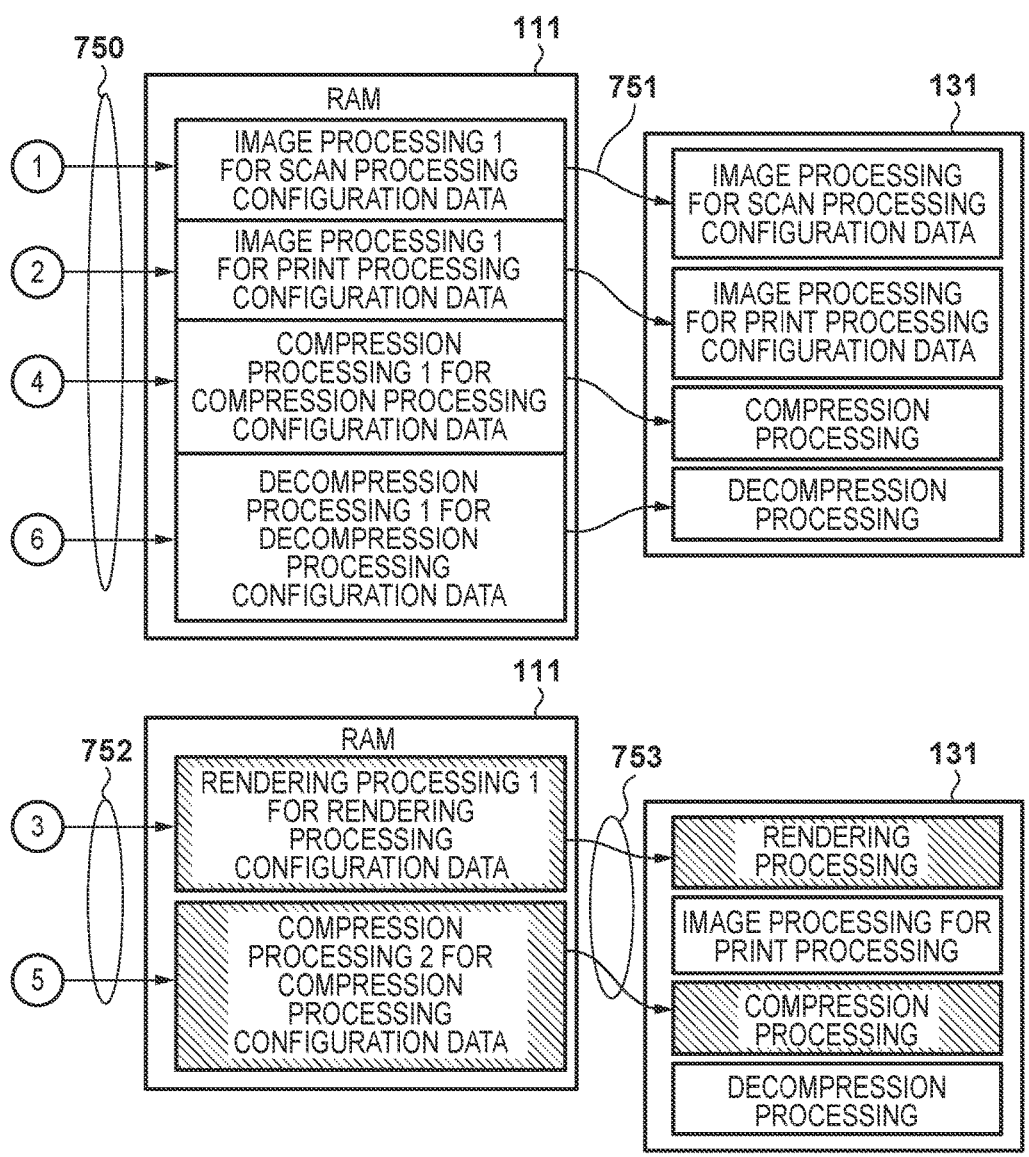

As shown in FIGS. 7A and 7B, in step S409 the configuration controller 130 accepts a first job and causes (750 in FIG. 7A) the configuration data 701, 702, 704 and 706 as shown in FIGS. 7A and 7B to be pre-loaded from the ROM 104 to the RAM 111. Next, the configuration controller 130 executes reconfiguration (751 of FIG. 7B) using the configuration data 701, 702, 704 and 706 which was pre-loaded to the reconfiguration unit 131 upon execution of reconfiguration in step S410.

Next, when the image processing apparatus 100 accepts a second job, the CPU 101 specifies, in step S406, a difference in the processing between the accepted first and second jobs. According to the specified processing difference, the configuration controller 130 pre-loads, in step S409, to the RAM 111 image processing 1 configuration data for rendering processing 703, and compression processing 2 configuration data for compression processing 705, which correspond to differences in the processing of the jobs (752 of FIG. 7B).

Upon execution of reconfiguration in step S410, the configuration controller 130 executes reconfiguration using configuration data 703 and the compression processing 2 configuration data for compression processing 705 which were pre-loaded into the RAM 111 in the reconfiguration unit 131 (reference numeral 753 of FIG. 7B). At this time, the reconfiguration unit 131 reconfigures, changing from image processing for scanning to the image processing function for rendering processing, and from the line processing input of the compression processing to the rectangle processing input of the data processing configuration.

<Reconfiguration Processing Timing Chart>

Next, an explanation will be given with reference to FIG. 8 for a timing chart for reconfiguration processing when applying the present invention according to the present embodiment. The upper part of FIG. 8 shows a timing chart of processing of a comparative example approach when applied, and reference numerals 820 and 830 of FIG. 8 show a timing chart of processing when the present invention is applied. A job type selection 800 of FIG. 8 shows a step in which the job type is determined, when selecting one of the job selection icons 202-204 in the main menu screen 200.

An interval from the job type selection 800 until a step of a job initiation 801, in which a job initiation request is made, is an interval of a setting change by a user. After the job initiation 801, in a comparative example 810, all circuits for implementing settings of a job denoted by reference numeral 803 are selected. Thereafter, in reference numeral 804, after reconfiguring all processes, a job execution 805 is performed.

On the other hand, reference numerals 804 and 805 that are shown in reference numeral 820 determine the content of the job and select only differences with the previously executed job, and perform only reconfiguration of a circuit units that changed. For this reason, compared with the case of reconfiguring all processing circuits (reference numeral 810), since the scale of the circuits that are reconfigured is small, the interval required to perform the reconfiguration is shorter. The processing in reference numerals 804 and 805, as described above, is determined by the CPU 101, and reconfiguration is performed by the configuration controller 130. After completing the reconfiguration, execution of a job by the CPU 101 is performed in reference numeral 805.

Also, as shown in reference numeral 830, in the case when more detailed processing circuits are used as the units of processing for performing the reconfiguration, execution is performed a plurality of times in accordance with the number of reconfiguration processes into which the performance of the reconfigurations is divided. However, since the circuits the processing units at which the reconfiguration is performed are a smaller scale circuits, each reconfiguration time in reference numeral 807 is shorter than the reconfiguration time 806 shown in reference numeral 820. In the entirety of the interval 807, over which the reconfiguration is completed, there are cases in which, in order to execute the previous multiple reconfigurations, the reconfiguration time is longer than in the case of reference numeral 820, but shorter than in the comparative example 810.

As explained above, the image processing apparatus 100 according to the present embodiment extracts (specifies) a difference between a circuit configuration for processing an accepted job and a circuit configuration that is configured in the reconfiguration circuit, and based on this difference, selects functional blocks to be reconfigured by the reconfiguration circuit, reads out required configuration data from a storage unit, and reconfigures the reconfiguration circuit. Also, the image processing apparatus 100 can select functional blocks in accordance with a predetermined constraint condition. With this, the image processing apparatus 100 in addition to being operable such that the functional blocks that are newly rewritten cooperate with other functional blocks portions are not rewritten, can shorten a rewrite time taken for the reconfiguration.

Second Embodiment

Below, using FIG. 9 through FIG. 13 explanation will be given for a second embodiment of the present invention. In the above described first embodiment, a case is illustrated in which the image processing configuration units 132, 133, 134 and 135 prepared in the reconfiguration unit 131 and only a few reconfiguration units are held. In the first embodiment, DMACs for each image processing configuration unit and an image processing unit that is connected to the DMACs are implemented on a single image processing configuration unit. In the present embodiment, an explanation will be given for a case of dividing into more detailed processing circuits to perform reconfiguring in the case of a large number of image processing reconfiguration units being comprised in the reconfiguration unit 131. As a case shown in the present embodiment, DMACs and an image processing unit connected thereto are implemented on separate image processing configuration units.

<Reconfiguration Unit Configuration>

Figure 9:
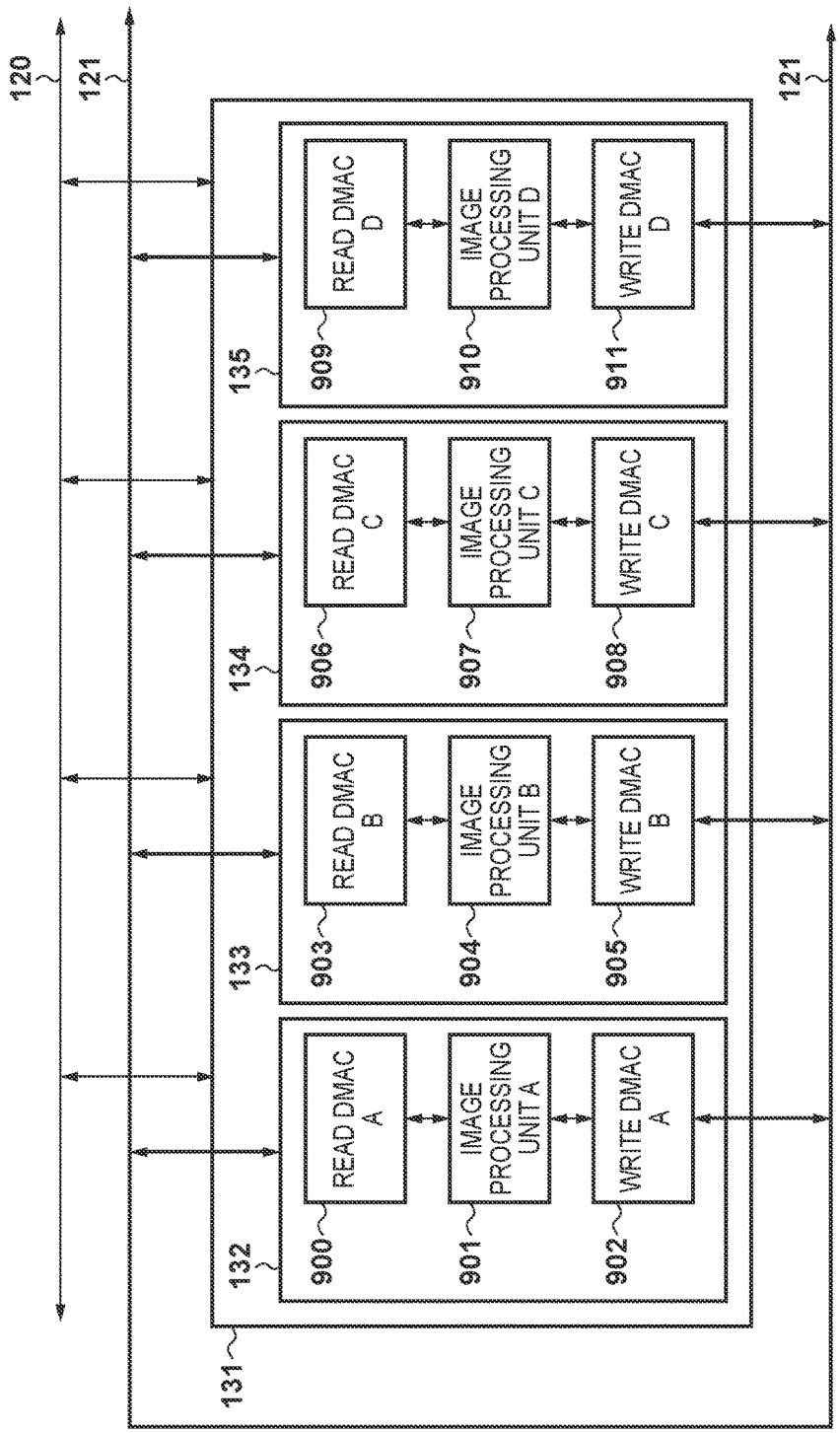
FIG. 9 is a block diagram representing the image processing configuration configured by a reconfiguration unit according to a second embodiment.

First, with reference to FIG. 9, an explanation will be given for a configuration of the reconfiguration unit 131 according to the present embodiment. The image processing configuration units that are configured inside of the reconfiguration unit 131 are configured from the reconfigurable circuits 901, 904, 907 and 910 which each perform the image processing. Also, the image processing configuration units are comprised of the circuits of read DMACs 900, 903, 906 and 909 and the circuits of write DMACs 902, 905, 908 and 911.

<Relationship of Jobs to Processing>

Next, a relationship between each kind of job that the image processing apparatus 100 accepts by the operation unit 103 and processing executed on the reconfiguration unit 131 that corresponds to these is described with reference to FIGS. 10A to 10C. The processing relationships shown in FIGS. 10A to 10C, from the processing relationship shown in FIGS. 3A and 3B, consider the relationships with respect to the data processing formats (rectangle processing, line processing, linear processing) relationships shown in the present embodiment.

Each type of job and setting shown in FIGS. 10A to 10C correspond to a type of a job and a setting of a job set by the operation unit 103 in FIG. 2. The processing groups which can support each job are broadly divided into scan processing, print processing, compression processing, and decompression processing. Additionally, for a process that is selected by the CPU 101, processing of a write DMAC and a read DMAC that perform transferring of data is added. Of course there is processing other than this, and processing circuits for performing a reconfiguration similarly according to settings are prepared.

<Reconfiguration Control Sequence>

Figure 11:
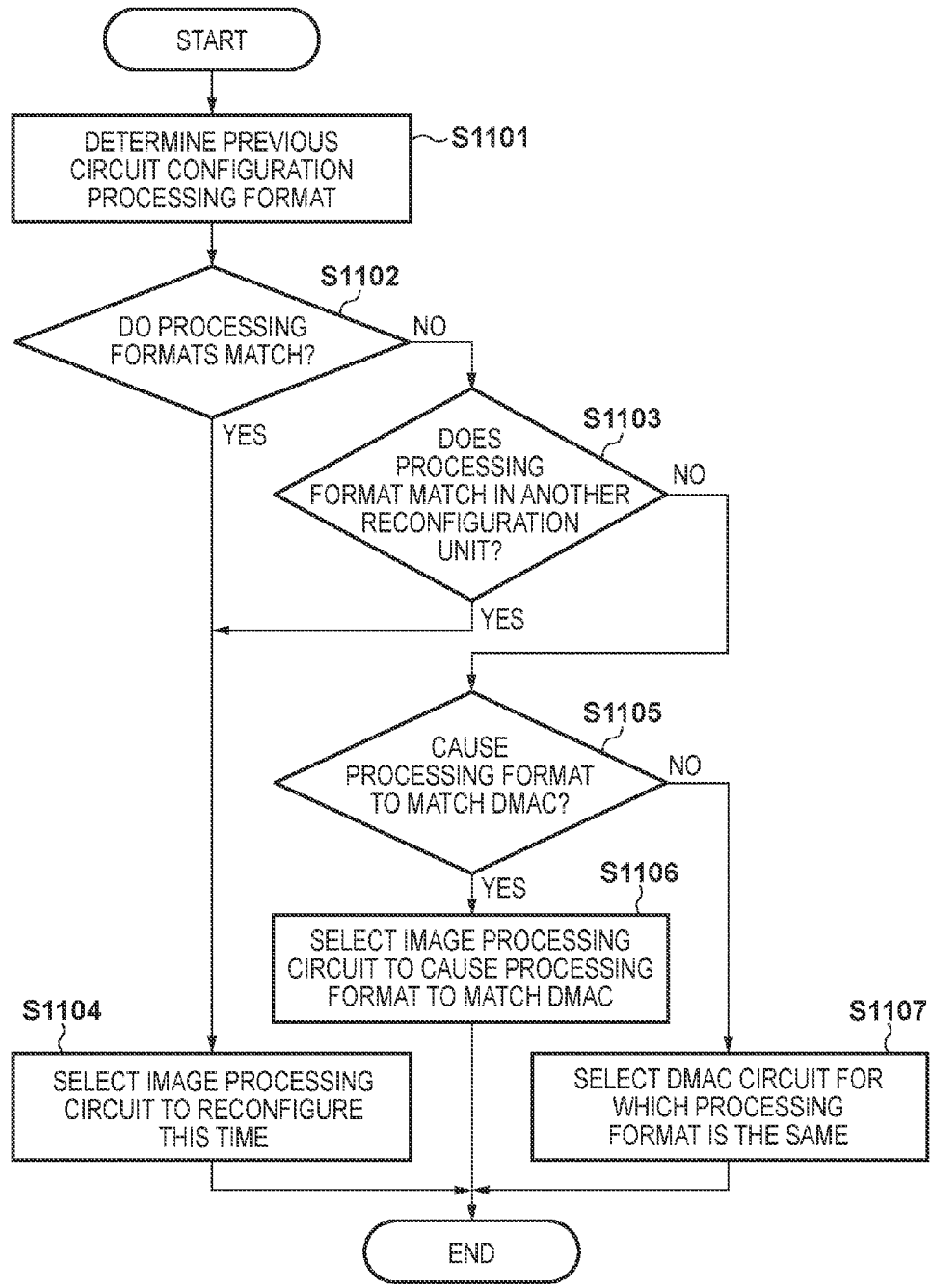
FIG. 11 is a flowchart for representing control for reconfiguration of the image processing unit upon a setting change of the image processing apparatus according to the second embodiment.

Next, when reference to FIG. 11, an explanation will be given for a procedure of a particular (step S408 of FIG. 4) process of a reconfiguration circuit when implementing the reconfiguration of the CPU 101. Steps of another processing flow follow the processing flow shown in FIG. 4 of the above described first embodiment. Processing explained below is realized by the CPU 101 executing a control program stored in the ROM 104 on the RAM 111.

In step S1101, the CPU 101 determines a process format of each image process in the reconfiguration unit 131 which is configured by the first job. Here, it is determined whether line processing is being performed or rectangle processing is being performed. Then, in step S1102, the CPU 101 determines whether or not a process format matches. In the case of a match, the processing transitions to step S1104, and in the case that the processing formats do not match, the processing transitions to step S1103. In step S1104 the CPU 101 determines that the processing formats match and selects the image processing circuit which is reconfigured.

In the case where the processing formats do not match, in step S1103 it is determined whether or not a processing format exists which matches in another image processing unit. For example, a process format of a read DMAC and a write DMAC before reconfiguration is line processing, and in the case that a process format of image processing which performs reconfiguration is rectangle processing, the CPU 101 determines whether there is another reconfigurable read DMAC and write DMAC which perform rectangle processing. In step S1103, in the case that it is determined that there exists another processing format which matches, the processing transitions to step S1104.

On the other hand, in step S1103, if there is no other processing format that matches, the processing transitions to step S1105. In step S1105, the CPU 101 determines whether or not the processing format is caused to match the processing format performed on the DMAC. For example, in the case that the processing format of the read DMAC and the write DMAC is line processing, and it is determined that the processing format of the DMAC is caused to be matched, the CPU 101, in step S1106, selects to configure by a line processing circuit such that the image processing is matched to the processing format of the DMAC. On the other hand, in the case that in step S1105 it is determined that the processing format of the DMAC is not caused to be matched, the CPU 101 selects in step S1107 such that a read DMAC and a write DMAC are configured by a rectangle processing circuit.

<Example Configuration of Image Processing Circuit that is Configured in Reconfiguration Unit>

Figure 12:
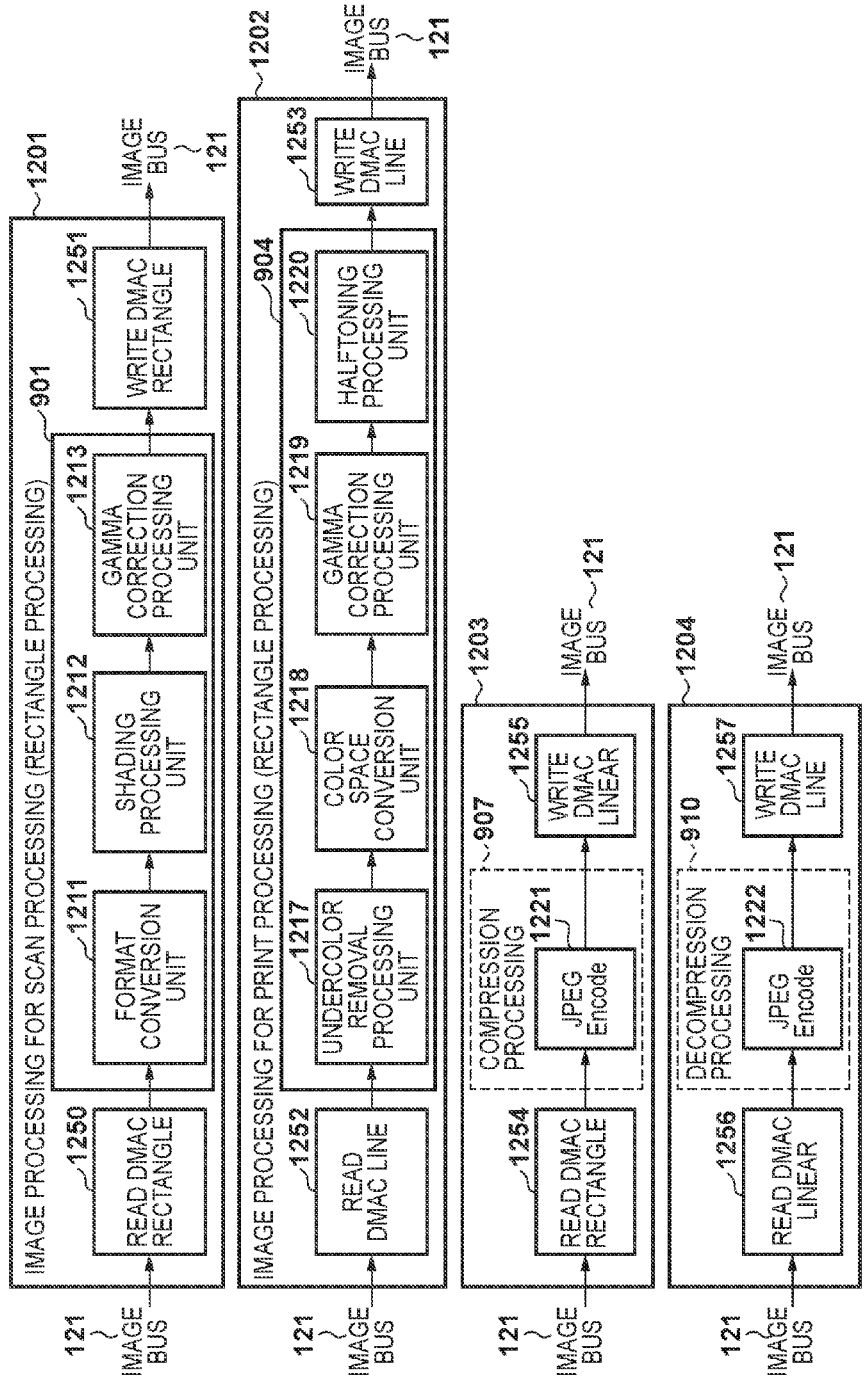
FIG. 12 is a view for explaining functions of the image processing apparatus according to the second embodiment and image processing functions comprised in reconfiguration units.
Figure 13:
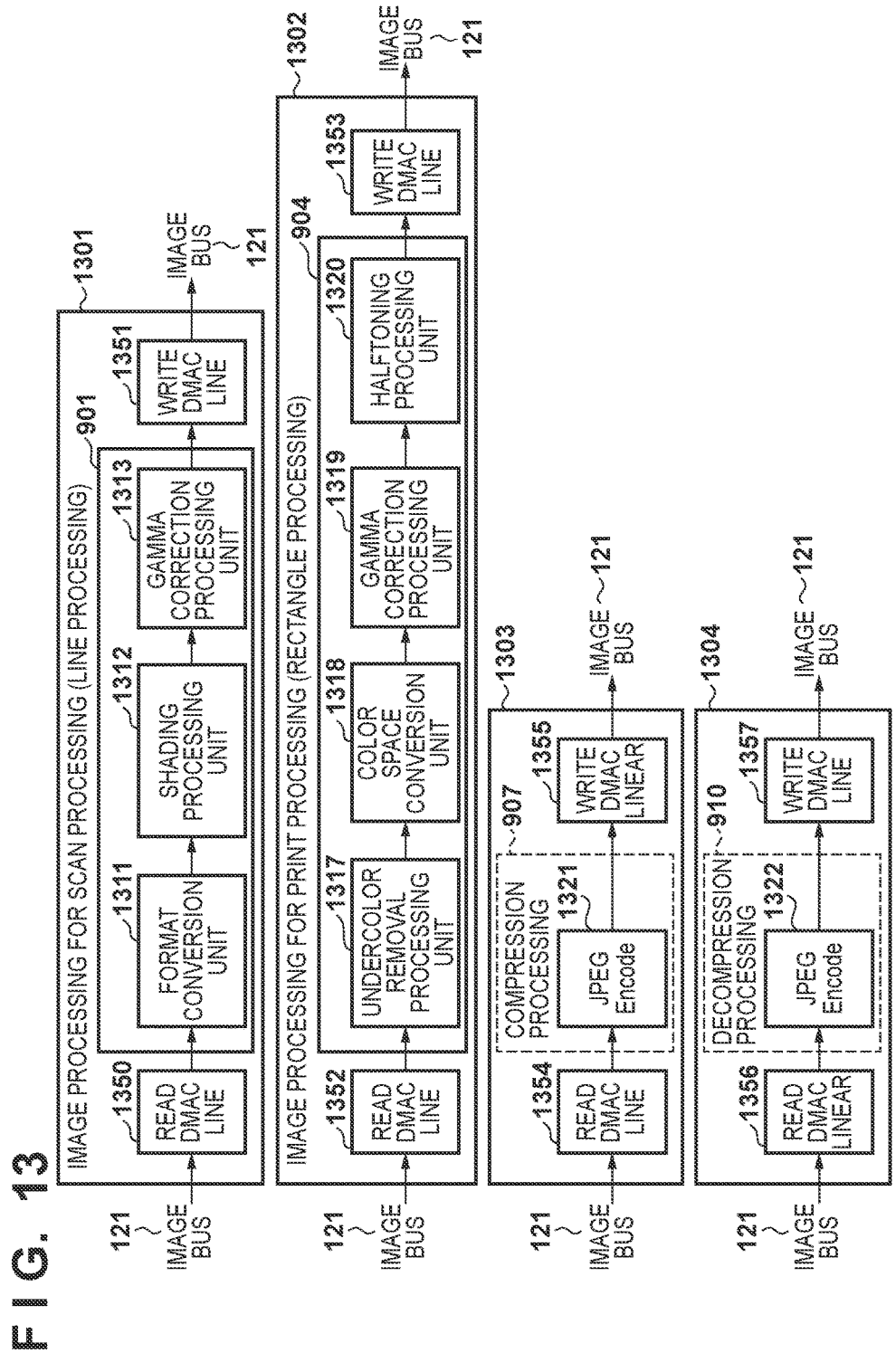
FIG. 13 is a view for explaining functions of the image processing apparatus according to the second embodiment and image processing functions comprised in reconfiguration units.

Referring to FIG. 12 and FIG. 13, an explanation will be given of a relationship between image processing functions and configuration data that is configured in the reconfiguration unit 131 according to job content, in the image processing apparatus according to the present embodiment. In FIG. 12, a state of image processing functions that, having accepted a first job, are configured on the reconfiguration unit 131 to process the job is shown.

As a first job, an explanation will be given for a case when a monochrome image copy job is accepted via the operation unit 103. In the case when a monochrome image copy job is accepted, monochrome image processing for scanning which is processing when reading in an original, and image processing for printing out which is image processing for printing are required as processing content that is performed by the reconfiguration unit 131. Also, there is a need for compression processing (encoding processing) for image data for which monochrome image processing for scanning is performed, and decompression processing (decoding processing) which decompresses compressed data before executing image processing for printing.

Image data of an original read at the scanner unit 109 is stored from the image bus 121 to the RAM 111 as a copy job via the scan I/F 108. Continuing on, image data that is stored in the RAM 111 is read out through the image bus 121 by a read DMAC 1250. Image processing for scanning a monochrome image is performed on image data which is read out, and image data of the processing result is written back to the RAM 111 by a write DMAC 1251. Here, first image processing for scanning of a monochrome image is image processing that is performed by rectangle processing. Similarly, the write DMAC 1251 is a DMA control circuit which performs rectangle processing to support the rectangle processing which is executed by the image processing for scanning (reference numeral 1201 of FIG. 12). The first image processing for scanning performs format conversion of image data in reference numeral 1211, performs shading correction processing in reference numeral 1212, and performs gamma correction processing in reference numeral 1213. The processing result is output to the image bus 121 by the previous write DMAC 1251. The read DMAC 1250 is configured in reference numeral 900 and the write DMAC 1251 is configured in reference numeral 902. Other separate image processes 1211, 1212, and 1213 are configured in the image processing unit 901.

Next, the image data for which image processing for scanning which is stored in the RAM 111 was performed is read out by a read DMAC 1254, and compression processing is performed. A write DMAC 1255 writes back the linear processing data for which compression processing was performed to the RAM 111. The image processing function that realizes the above-described process content corresponds to the circuit configuration that is shown in reference numeral 1203 of FIG. 12.

Next, the compressed data that is stored in the RAM 111 is read out by a read DMAC 1256 and decompression processing is performed. Data for which decompression processing has been performed is output as line form image data and is of a line processing format. A write DMAC 1257 writes back the line processing data for which decompression processing was performed to the RAM 111. The image processing function that realizes the above-described process content corresponds to the circuit configuration that is shown in reference numeral 1204 of FIG. 12.

Next, an explanation will be given for image processing for printing for performing print processing. The image processing for printing performs image processing for printing for which the processing units are made to correspond to line processing. A read DMAC 1252 and a write DMAC 1253 are circuits for performing DMA control for performing line processing (reference numeral 1202 in FIG. 12). Image processing for printing performs processing removing background undercolor in 1217, and performs CMYK color space conversion of RGB data in accordance with an output characteristic of the image processing apparatus in 1218. A gamma correction of the image data is performed in reference numeral 1219. Halftoning processing is performed in reference numeral 1219. The processing result is outputted to the image bus 121 by the write DMAC 1253 (reference numeral 1202 in FIG. 12). The read DMAC 1252 is comprised in reference numeral 903, the write DMAC 1253 is comprised in 905, and the print image processing (reference numerals 1217-1220) is comprised in the image processing unit 904.

Next, explanation will be given for a case where color image copy job processing is accepted by the image processing apparatus 100 as a second accepted job. The second job is the next job accepted from the operation unit 103 after executing processing for the first job by the reconfiguration unit 131. FIG. 13 shows a state of the image processing functions that are configured on the reconfiguration unit 131 for processing the second job.

Color image processing for scanning which is processing when an original is read, and image processing for printing which is image processing for printing out are required as processing content performed by the reconfiguration unit in a case where the second color image copy job is accepted. Also, there is a need for compression processing (encoding processing) for image data for which color image processing for scanning is performed, and decompression processing (decoding processing) which decompresses compressed data before executing image processing for printing.

The image processing for scanning, and the compression processing which accompanies the processing format of the image processing for scanning are the differences in the processing as compared to the first job. The processing format of the image processing for the scanner is changed from reading rectangle data in the monochrome image processing to reading line data in the color image processing.

The image processing for scanning of the color image which is changed to by the second job performs the image processing for scanning on the image data read out from the RAM 111 using a read DMAC 1350, and writes back the image data of the processing result to the RAM 111 using a write DMAC 1351. Here, the image processing for scanning of the color image is image processing that is performed by line processing. Similarly, the write DMAC 1351 and the read DMAC 1350 are also the circuits for DMA control for performing line processing (reference numeral 1301 in FIG. 13). The image processing for scanning the color image performs format conversion of image data in reference numeral 1311, performs shading correction processing in reference numeral 1312, and performs gamma correction processing in reference numeral 1313. The processing result is output to the image bus 121 by the previous write DMAC 1351. The read DMAC 1350 is reconfigured in reference numeral 900 and the write DMAC 1351 is reconfigured in reference numeral 902. Other image processes 1311, 1312 and 1313 are reconfigured in the image processing unit 901.

Next, the image data for which image processing for scanning which is stored in the RAM 111 was performed is read out by a read DMAC 1354, and compression processing is performed. In the read DMAC 1354, line processing is performed. A write DMAC 1355 writes back linear processing data for which compression processing was performed to the RAM 111. The image processing function that realizes the above-described process content corresponds to the circuit configuration that is shown in reference numeral 1303 of FIG. 13. The read DMAC 1354 is reconfigured in reference numeral 906 and the write DMAC 1355 is reconfigured in reference numeral 908. Compression processing 1321 is reconfigured in 907.

Next, the compressed data that is stored in the RAM 111 is read out by a read DMAC 1356 and decompression processing is performed. Data for which decompression processing has been performed is output as line form image data and is of a line processing format. A write DMAC 1357 writes back the line processing data for which decompression processing was performed to the RAM 111. The image processing function that realizes the above-described process content corresponds to the circuit configuration that is shown in reference numeral 1304 of FIG. 13. The decompression processing may be the same processing with the first job, so the reconfiguration is not performed.

Next, an explanation will be given for image processing for printing for performing print processing. The image processing for printing may be the same processing as that of the first job, so the reconfiguration is not performed. So, each process is the same as the processing executed by the first job (reference numeral 1302 in FIG. 13).

Next, explanation will be given for processing for determining the reconfiguration to perform upon reconfiguration when the first job and the second job are received. The CPU 101 determines the difference in the job content between the first job and the second job, and performs specification of the reconfiguration circuits that configure the differences in the processing content. Here, there is the configuration constraint that the circuit configuration minimizes the circuits to which the reconfiguration is performed. In step S407 and in step S408 in FIG. 4, in a case where the configuration is executed, the CPU 101 preferentially selects a configuration such that the target image processing unit to be reconfigured is of the same scheme as the peripheral processing, so that the number of time that reconfiguration is performed is as small as possible. The smaller the image processing unit which is the target for performing the reconfiguration becomes, the smaller the number configurations there will be in the reconfiguration. As a result, execution time required for the previously described reconfiguration becomes shorter.

As explained above, the processing formats of the read DMAC and the write DMAC are determined in the present embodiment first. For the data processing format of the DMAC line processing, linear processing, and rectangle processing is considered, and it is necessary to match the processing format handled by each image process. As shown in FIG. 13, as an alternative of the reconfiguration for performing the second job, firstly image processing for reconfiguration is required is selected, it is determined that the processing formats of the read DMAC and the write DMAC required for the data transfer of the image processing match, and a combination with the same processing format is selected. Of course, if the format of processing data of the image processing (here, the line processing format and the rectangle processing format) is not caused to match the image processing content and the DMAC, correct processing cannot be performed. The CPU 101 according to the present embodiment determines the processing formats of the read DMAC and the write DMAC which handle processing data transferring when each image processes is configured.

Third Embodiment

Figure 14:
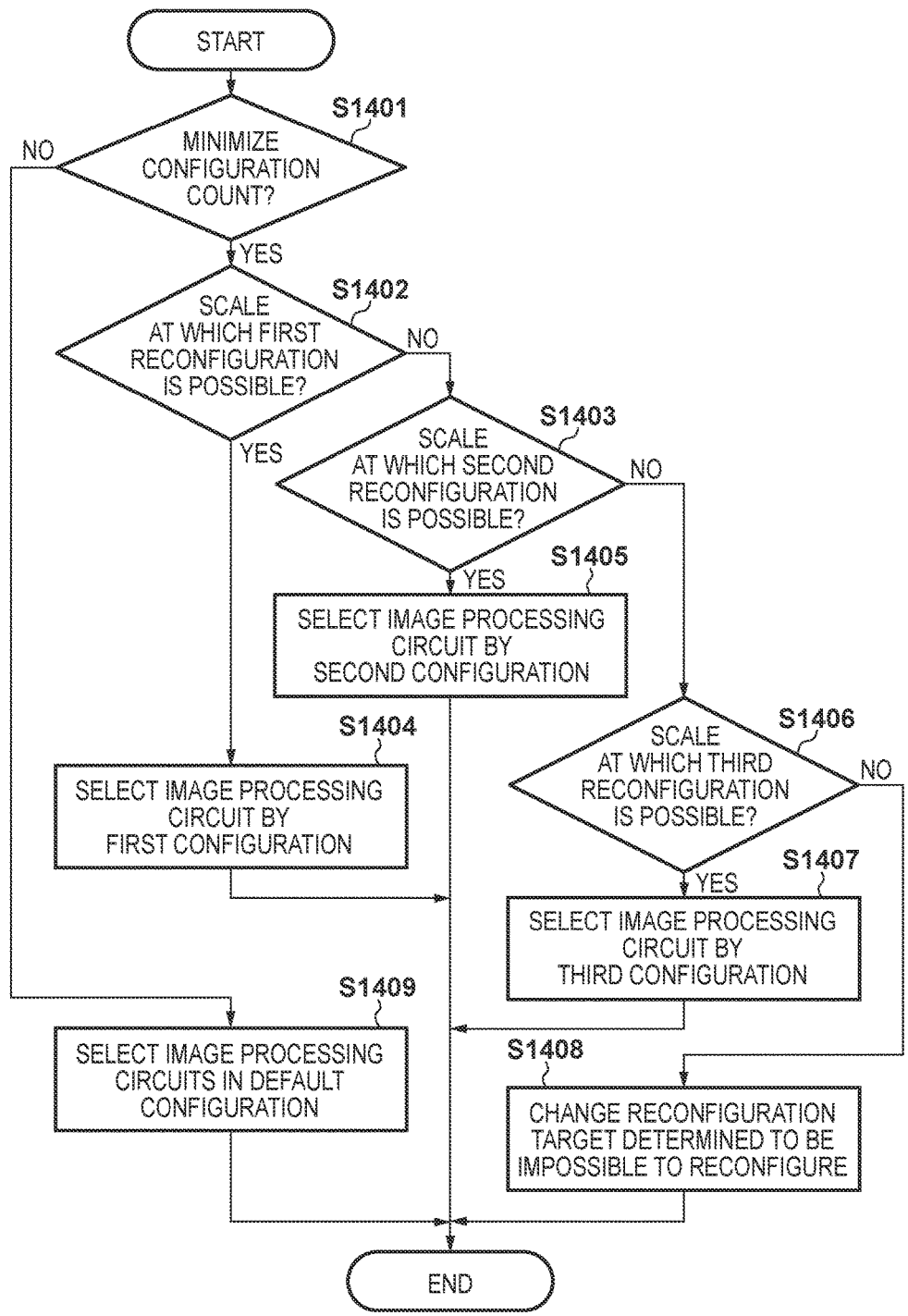
FIG. 14 is a flowchart for representing control for reconfiguration of the image processing unit upon a setting change of the image processing apparatus according to a third embodiment.

Below, with reference to FIG. 14 and FIG. 15 explanation will be given for a third embodiment of the present invention. In the above described second embodiment, explanation was given for the determination of the reconfiguration when the processing format does not match in a case in which the reconfiguration unit 131 comprises of large number of image processing reconfiguration units. On the other hand, in the present embodiment, explanation will be given for an example where the circuit scale and the configuration count are the determination criteria for the reconfiguration in a case where a large number of image processing reconfiguration units are comprised similarly to in the above described second embodiment. The reconfiguration unit 131 is in accordance with the reconfiguration unit 131 in the second embodiment.

<Reconfiguration Control Sequence>

Firstly, explanation will be given for a processing procedure in the present embodiment with reference to FIG. 14. The sequence of the reconfiguration control in the reconfiguration unit 131 follows the reconfiguration control sequence in FIG. 4 in the above described first embodiment. A processing step of a specifying (step S408 in FIG. 4) unit of the reconfiguration circuit upon the reconfiguration execution in the sequence is explained in detail below. Processing explained below is realized by the CPU 101 executing a control program stored in the ROM 104 on the RAM 111.

In step S1401, the CPU 101 determines whether or not the configuration count is minimized based on a reconfiguration constraint requested by the second job. That is, it is determined whether a time for the reconfiguration is suppressed by minimizing the configuration count which is one of the causes that the reconfiguration takes time. In such a case, there is the effect that for the user, the waiting time from when a job is accepted to when the processing of the image processing apparatus 100 is initiated is suppressed. Note that the determination in step S1401 may be performed by referring to setting information input by the user in advance, and may be performed with reference to information stored as model information of the image processing apparatus 100 upon shipping of the product. In a case of the former, a user interface for accepting user input is required, and this may be performed upon inputting the job, or may be performed at any other timing in advance.

In step S1401, if there is a constraint minimizing the configuration count, transition is made into step S1402, and in a case where there is not the constraint, transition is made into step S1409. In step S1409, the CPU 101 selects the image processing circuits for reconfiguring by a default configuration (here, a configuration using 4 reconfiguration units) because there is no constraint for the configuration count, and the processing completes.

On the other hand, in step S1402 the CPU 101 determines a configuration for a case where the configuration count is minimized, and determines whether or not the configuration can be reconfigured in terms of the circuit scale. In a case where a circuit scale which can be configured in the image processing unit 133 is within a scope in which all of the PDL print processing can be configured, the processing proceeds to step S1404, the CPU 101 selects the circuit for which the reconfiguration is performed in the image processing unit 133, and the processing completes. This circuit configuration is assumed to be a first reconfiguration.

In a case where it is determined that the circuit scale exceeds the first reconfiguration in step S1402, the processing proceeds to step S1403 and the CPU 101 determines whether or not it is able to reconfigure by a second reconfiguration. In a case where it is determined that it is possible to reconfigure at the circuit scale of the second reconfiguration, the processing proceeds to step S1405, the CPU 101 selects the circuit configurations for performing reconfiguration in the image processing units 133, 134, and 135 and the processing completes. On the other hand, in a case where it is determined that the circuit scale is exceeded by the second reconfiguration, the processing proceeds to step S1406 and the CPU 101 determines whether or not it is able to reconfigure using the third reconfiguration.

In a case where it is determined that the circuit scale is exceeded, the processing proceeds to step S1408, the CPU 101 changes the reconfiguration target, determines a wider scope image processing configuration, and selects the reconfiguration within which the circuit scale fits, and the processing completes. On the other hand, in a case where it is determined that it is possible to reconfigure in the circuit scale of the third reconfiguration, the processing proceeds to step S1407, the CPU 101 selects the circuit for performing the reconfiguration in the image processing units 132, 133, 134 and 145, then the processing completes.

<Example Configuration of Image Processing Circuit that is Configured in Reconfiguration Unit>

Figure 15:
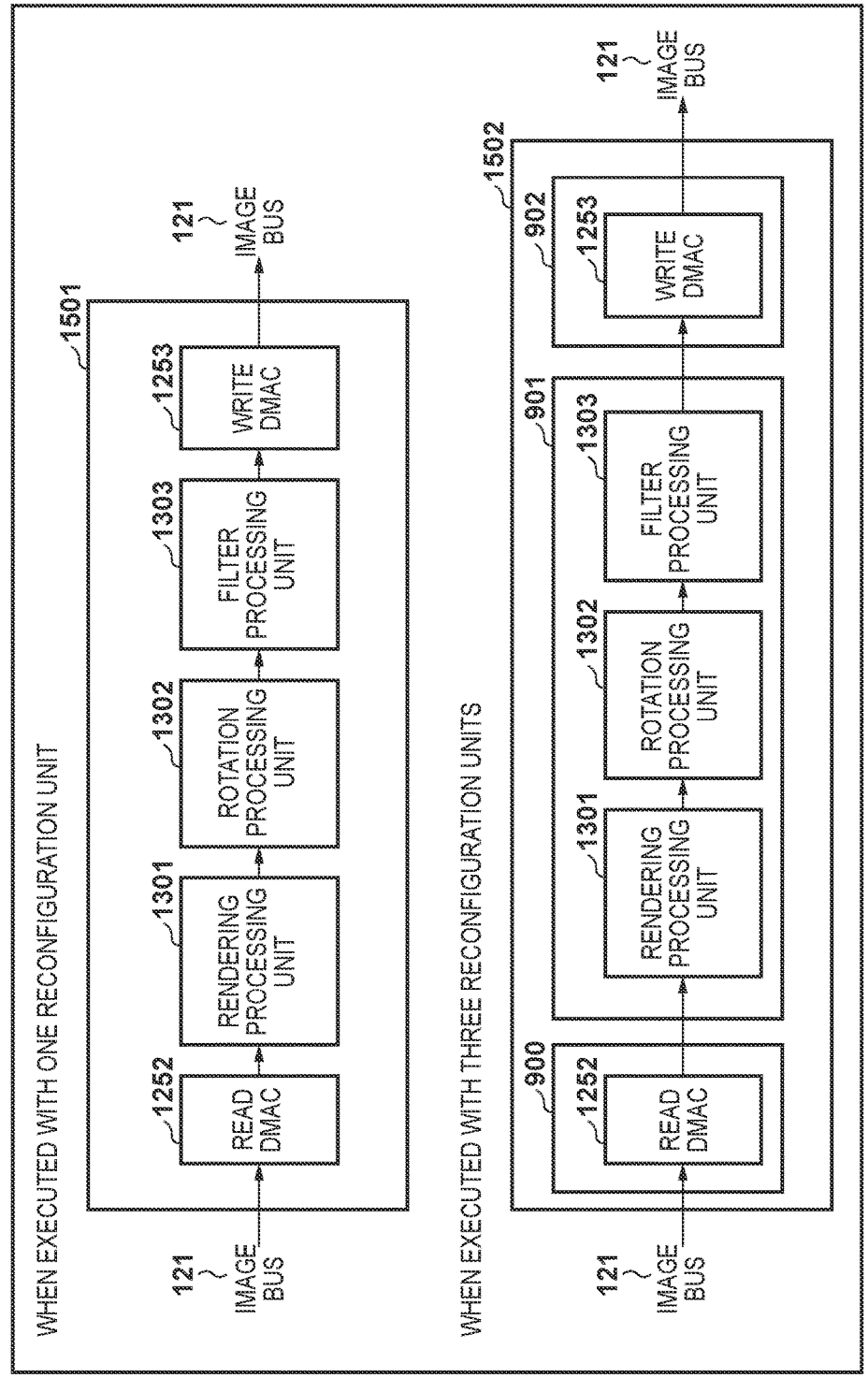
FIG. 15 is a view for explaining functions of the image processing apparatus according to the third embodiment and an example configuration of the image processing unit comprised in the reconfiguration unit.

Next, with reference to FIG. 15, reconfiguration in the present embodiment is explained using an example of a circuit configuration in the reconfiguration unit 131 for the PDL print processing unit (reference numeral 601 in FIG. 6) which is an example of reconfiguration for performing the second job processing shown in the above described first embodiment. The processing configuration required for performing the PDL print processing is the image processing for rendering, the rectangle processing read DMAC and the rectangle processing write DMAC. An example of 2 patterns which are configuration patterns for reconfiguring these is shown in FIG. 15.

A configuration shown in reference numeral 1501 in FIG. 15 is an example configuration where the above described 3 processing configurations in the first embodiment is realized by the image processing configuration unit 132. In such a case, the processing is completed by a single reconfiguration of reference numeral 132. On the other hand, a configuration shown in reference numeral 1502 in FIG. 15 is an example configuration where the above described 3 processing configurations are realized by configuration units 900, 901 and 902 respectively, based on the reconfiguration unit 131 (FIG. 9) shown in the second embodiment. In such a case, reconfiguration processing occurs 3 times. Specifically these are the reconfiguration of the read DMAC for reference numeral 900, the reconfiguration of the image processing unit for reference numeral 901, and the reconfiguration of the write DMAC for reference numeral 902. For example, in a case where the circuit scale of the configuration unit for which the reconfiguration is performed is larger than the scale of the processing circuit for which the reconfiguration is performed, the reconfiguration can be performed. As a result, if the circuit configuration shown in reference numeral 1501 is possible, the configuration count for the reconfiguration can be reduced.

According to the present embodiment, the processing content for which the reconfiguration is performed in the configuration for which the reconfiguration is performed is determined considering the condition of the scale of the circuit that can be reconfigured in one go. In a case where the image processing unit for which the reconfiguration is performed is allocated to a region of a large circuit scale, depending on the processing content for which the reconfiguration is performed, more unused circuits may exist in the image processing unit. On the other hand, a case may occur in which, when the image processing unit for which the reconfiguration is performed is allocated to a region of a more detailed circuit scale, upon reconfiguration to that image processing unit, the circuit does not fit. In such a case, it is necessary to perform the reconfiguration having broken down the processing content of the reconfiguration determined by the CPU 101 more finely. In such a case, many image processing units for which the reconfiguration is performed exists, and the configuration count increases. In this way, the configuration count and the circuit scale are in a trade-off relationship. In the present embodiment, the relationship between the configuration count (time taken for reconfiguration), and the circuit scale of the image processing unit for which reconfiguration is performed is considered, and the reconfiguration scope is adjusted by the CPU 101 based on configuration constraints for performing the reconfiguration.

Fourth Embodiment

Figure 16:
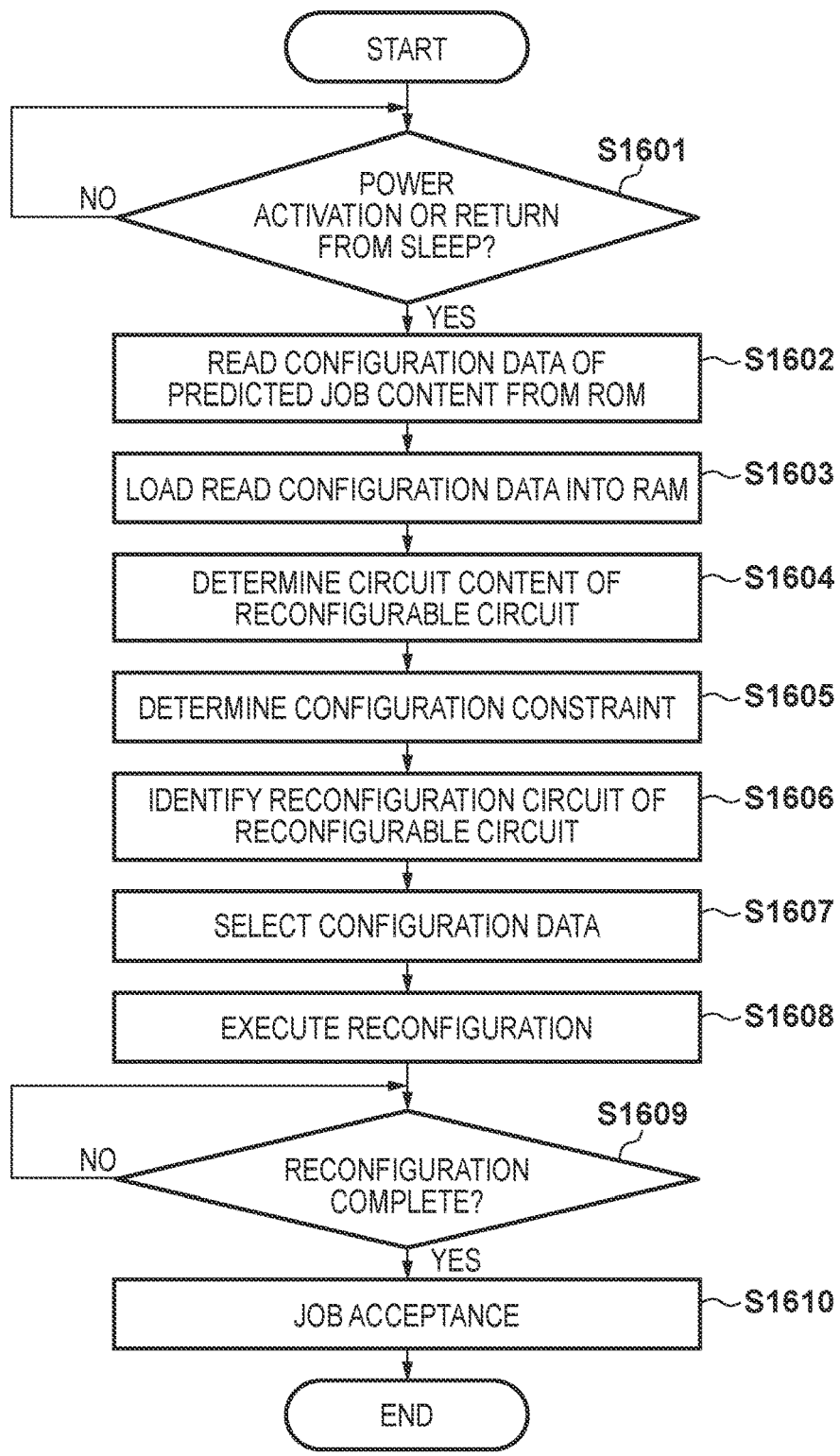
FIG. 16 is a flowchart for representing control for reconfiguration of the image processing unit upon a setting change of the image processing apparatus according to a fourth embodiment.

Below, with reference to FIG. 16, explanation will be given for a fourth embodiment of the present invention. In the present embodiment, explanation will be given for an example in a case where the image processing apparatus 100 performs the reconfiguration after a power supply activation or a return from sleep. Other than the processing sequence unit for the reconfiguration after the power supply activation or the return from sleep, everything follows the above described first embodiment, so explanation will be omitted.

In order to make the processing completion time of an initial job after the power supply activation or the return from sleep earlier, the image processing apparatus 100 according to the present embodiment configures predicted initial job content in the reconfiguration unit 131 in advance. By configuring the predicted processing circuit in the reconfiguration unit 131 in advance, the processing time until the initial job is executed can be reduced when the initial job is accepted by reconfiguring only differences in the processing between the circuit configuration required for the job and the circuit configuration configured in advance. In the present embodiment, explanation will be given for a circuit configuration configured in advance relating to a job executed by the image processing apparatus 100 initially.

The CPU 101 pre-loads configuration data indicating the circuit configuration of the predicted processing content from the ROM 104 to the RAM 111 after the power supply activation or the return from sleep. At this timing, it is assumed that a job is not accepted yet. Then, the CPU 101 performs the configuration for the reconfiguration unit 131 through the configuration controller 130. With this, the image processing apparatus 100 can process the initial job processing at higher speed after the power supply activation or the return from sleep, and the processing waiting time for the user can be shortened. Note that in a case where a job is accepted at a timing after the power supply activation or the return from sleep, the configuration data corresponding to the circuit configuration in accordance with the job is used. Also, it is advantageous that configuration data indicating circuit configurations configured initially, which are defined to correspond to reasons that the image processing apparatus 100 activated (for example, a power supply activation, or a return from sleep due to a network access) is stored in the ROM 104.

<Reconfiguration Control Sequence>

Next, explanation will be given for a sequence of the reconfiguration control in the reconfiguration unit 131 after the power supply activation or the return from sleep with reference to FIG. 16. The control flow is initiated after the power supply activation or the return from sleep. Processing explained below is realized by the CPU 101 executing a control program stored in the ROM 104 on the RAM 111.

In step S1601, the CPU 101 determines whether or not a power supply activation or a return from sleep was executed. In a case where the power supply activation or the return from sleep was executed, transition is made to step S1602. In step S1602, the CPU 101 reads in the content of the predicted job from the ROM 104 after the image processing apparatus 100 returns. As explained above, the configuration data of the processing content predicted for after the return is stored in the ROM 104 in advance. In step S1603, the CPU 101 stores the read configuration data in the RAM 111. For example, in a case where a copy job is predicted, the CPU 101 reads in the configuration data of each process of the scan image processing and the print image processing required for the copy processing, and setting parameters required for the each process.

Next, in step S1604 the CPU 101 specifies the circuit configuration for which the reconfiguration is performed in the reconfiguration unit 131 from the configuration data loaded in step S1603. In step S1605, the CPU 101 determines whether or not there is the constraint condition upon performing the reconfiguration based on the configuration data. For example, this may be a condition for minimizing the time for the reconfiguration of the circuit for which the reconfiguration is performed for the initial job.

In step S1606, the CPU 101 specifies the circuit configuration for performing the reconfiguration according to the constraint determined in step S1605. Then, in step S1607 the configuration controller 130 extracts (specifies) the configuration data realizing the circuit performing the reconfiguration from the configuration data stored in the RAM 111. Regarding this configuration data, a single reconfiguration may be executed by selecting a plurality of configuration data items in fine processing units according the circuit configuration for which the reconfiguration is performed. Alternatively, the processing units for performing the reconfiguration may be set to be larger, and one the reconfiguration may be executed by configuring a smaller number of configuration data items.

Next, in step S1608, the configuration controller 130 uses configuration data selected in step S1607 and reconfigures the reconfiguration unit 131. The reconfiguration is realized by rewriting the circuit from the previous configuration data to the reconfiguration unit 131 once again. In a case where the reconfiguration to the reconfiguration unit 131 is completed, the configuration controller 130 performs an interrupt notification for the reconfiguration completion towards the CPU 101 in step S1609. In step S1610, the CPU 101 receives the interrupt notification of the reconfiguration completion, performs acceptance of the job, and completes the processing of this flowchart.

According to the present embodiment, the image processing apparatus 100 performs a reconfiguration using configuration data corresponding to a job which is predicted to be executed after a power supply activation or a return from sleep. With this, the time interval between when the job is accepted and when the job is started can be shortened compared to when the reconfiguration is performed after the job acceptance. As examples of the initial job after the power supply activation or the return from sleep of the image processing apparatus 100, a copy job or a print job, or the like, may be predicted. The predicted initial job of the image processing apparatus 100 can be changed, and this can be realized by the CPU 101 selecting the configuration data from the ROM 104. Note that the processing sequence after the initial job is accepted is in accordance with the processing sequence in FIG. 5 shown in the first embodiment. Configuration may be taken such when the initial job is accepted, even if there are differences between the processing circuit predicted in advance and the initial job after the power supply activation or the return from sleep, the reconfiguration in the reconfiguration unit 131 is performed for only the processing differences. With this, the image processing apparatus 100 can reduce the processing time when executing processing of a job accepted initially after the power supply activation or the return from sleep is executed.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-079726 filed on Apr. 8, 2014, which is hereby incorporated by reference herein in its entirety.

The invention claimed is:
1. An image processing apparatus, comprising:
a partially reconfigurable device on which logic circuitry providing one or more image processing functions can be created and which can replace only a part of the logic circuitry with another logic circuitry;
at least one processor which functions as:
an accepting unit configured to accept an image processing job which is executed using predetermined image processing functions provided by logic circuitry created on the partially reconfigurable device;
a reconfiguration unit configured to cause the partially reconfigurable device to create, on the partially reconfigurable device, new logic circuitry providing at least one image processing function which is included in the predetermined image processing functions necessary for executing the accepted job and is not provided by current logic circuitry being on the partially reconfigurable device, with a part of the current logic circuitry which provides another image processing function included in the predetermined image processing functions kept on the partially reconfigurable device; and
an execution unit configured to execute the accepted image processing job using both (i) the new logic circuitry which has been created on the partially reconfigurable device and provides the at least one image processing function and (ii) the part of the current logic circuitry which has been kept on the partially reconfigurable device and provide the another image processing function.
2. The image processing apparatus according to claim 1, wherein the at least one processor further functions as a determination unit configured to determine whether or not there is a constraint condition for when the partially reconfigurable device is reconfigured,
wherein the reconfiguration unit,
in accordance with the constraint condition determined by the determination unit, determines configuration data to use for a reconfiguration.
3. The image processing apparatus according to claim 2, wherein the constraint condition is a condition related to at least one of a circuit scale of the reconfiguration circuit, and a rewrite count.
4. The image processing apparatus according to claim 3, wherein the reconfiguration unit determines the configuration data to use for the reconfiguration in accordance with a processing format of data used in a functional block included in the circuit configuration for processing the job.
5. The image processing apparatus according to claim 1, wherein the at least one processor further functions as a selection unit configured to select the at least one image processing function, in accordance with a difference between the predetermined image processing functions necessary for executing the accepted job and one or more image processing functions provided by the current logic circuitry being on the partially reconfigurable device, wherein the difference includes a difference of a processing format of image data handled in each image processing function.
6. The image processing apparatus according to claim 5, wherein
the processing format is a line processing format for handling image data in a line form, a rectangle processing format for handling image data in a rectangular form, or a linear processing format for handling compressed image data.
7. The image processing apparatus according to claim 1, further comprising:

a storage for storing circuit configuration data predicted for an initial job that is executed after a power supply activation or after a return from sleep, and the reconfiguration unit, after the power supply activation or after the return from sleep, reconfigures the partially reconfigurable device by reading the predicted configuration data from the storage prior to accepting a job.

8. The image processing apparatus according to claim 1, further comprising a storage storing a plurality of pieces of circuit configuration data, the plurality of pieces of circuit configuration data corresponding respectively to different image processing functions, and wherein the reconfiguration unit is further configured to identify the at least one image processing function, and wherein the partially reconfigurable device obtains, from among the plurality pieces of circuit configuration data, at least one piece of circuit configuration data corresponding to the at least one image processing function identified by the reconfiguration unit and create the new logic circuitry based on the obtained piece of circuit configuration data.

9. The image processing apparatus according to claim 1, wherein the circuit configuration data is data that is reconfigurable in finer processing units than the functional blocks.

10. The image processing apparatus according to claim 1, wherein the partially reconfigurable device does not create, for executing the accepted image processing job, logic circuitry which provides the another image processing function on the partially reconfigurable device.

11. An image processing method comprising:
at least one processor which functions as:
accepting an image processing job which is executed using predetermined image processing functions provided by logic circuitry created on a partially reconfigurable device, wherein the partially reconfigurable device on which logic circuitry providing one or more image processing functions can be created and which can replace only a part of the logic circuitry with another logic circuitry;

making, on the partially reconfigurable device, new logic circuitry providing at least one image processing function which is included in the predetermined image processing functions necessary for executing the accepted job and is not provided by current logic circuitry being on the partially reconfigurable device, with a part of the current logic circuitry which provides another image processing function included in the predetermined image processing functions kept on the partially reconfigurable device; and executing the accepted image processing job using both (i) the new logic circuitry which has been created on the partially reconfigurable device and provides the at least one image processing function and (ii) the part of the current logic circuitry which has been kept on the partially reconfigurable device and provide the another image processing function.

12. The image processing method according to claim 11, further comprising: selecting the at least one image processing function, in accordance with a difference between the predetermined image processing functions necessary for executing the accepted job and one or more image processing functions provided by the current logic circuitry being on the partially reconfigurable device, wherein the difference includes a difference of a processing format of image data handled in each image processing function.

13. The image processing method according to claim 12, wherein the processing format is a line processing format for handling image data in a line form, a rectangle processing format for handling image data in a rectangular form, or a linear processing format for handling compressed image data.

14. The image processing method according to claim 11, further comprising avoiding making, for executing the accepted image processing job, logic circuitry which provides the another image processing function on the partially reconfigurable device.

15. An image processing apparatus comprising:
a partially reconfigurable device on which logic circuitry providing an image processing function can be created with another logic circuitry left on the partially reconfigurable device;

one or more controllers which:

executes a first image processing job using logic circuitry created on the partially reconfigurable device;

accepts a second image processing job;

controls the partially reconfigurable device to newly create, on the partially reconfigurable device, logic circuitry providing an image processing function which is required in the second image processing job and is not required in the first image processing job, with a common logic circuitry providing an image processing function commonly required in both of the first image processing job and the accepted second image processing job left on the partially reconfigurable device; and executes the second image processing job using the common logic circuitry left on the partially reconfigurable device and the logic circuitry newly created on the partially reconfigurable device.

16. The image processing apparatus according to claim 15,
wherein the one or more controllers perform the control after executing the first image processing job.

17. The image processing apparatus according to claim 15,
wherein the common logic circuitry is a part of logic circuitry providing an image processing function required in the first image processing job.

18. The image processing apparatus according to claim 15,
wherein the common logic circuitry is used in both the first image processing job and the second image processing job.

19. A data processing method using a partially reconfigurable device on which logic circuitry providing a data processing function can be created with another logic circuitry left on the partially reconfigurable device, the data processing method comprising: executing a first data processing job using logic circuitry created on the partially reconfigurable device;

accepting a second data processing job;

controls the partially reconfigurable device to newly create, on the partially reconfigurable device, logic circuitry providing an data processing function which is required in the second data processing job and is not required in the first data processing job, with a common logic circuitry providing a data processing function commonly required in both of the first data processing job and the accepted second data processing job left on the partially reconfigurable device; and executing the second data processing job using the common logic circuitry left on the partially reconfigurable device and the logic circuitry newly created on the partially reconfigurable device.

20. The data processing method according to claim 19, wherein the newly creating of logic circuitry is performed after executing the first data processing job.

21. The data processing method according to claim 19, wherein the common logic circuitry is a part of logic circuitry providing a data processing function required in the first data processing job.

22. The data processing method according to claim 19, wherein the common logic circuitry is used in both the first data processing job and the second data processing job.

* * * * *